United States Patent
Yamazawa

(10) Patent No.: US 10,381,197 B2
(45) Date of Patent: Aug. 13, 2019

(54) TRANSFORMER, PLASMA PROCESSING APPARATUS, AND PLASMA PROCESSING METHOD

(71) Applicant: TOKYO ELECTRON LIMITED, Tokyo (JP)

(72) Inventor: Yohei Yamazawa, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 15/494,131

(22) Filed: Apr. 21, 2017

(65) Prior Publication Data
US 2017/0316948 A1  Nov. 2, 2017

(30) Foreign Application Priority Data
Apr. 27, 2016  (JP) ................. 2016-089389

(51) Int. Cl.
| | |
|---|---|
| H01F 27/00 | (2006.01) |
| H03H 7/00 | (2006.01) |
| H01F 38/14 | (2006.01) |
| H01F 38/18 | (2006.01) |
| H01J 37/32 | (2006.01) |

(Continued)

(52) U.S. Cl.
CPC ........ *H01J 37/32082* (2013.01); *H01F 27/00* (2013.01); *H01F 38/14* (2013.01); *H01F 38/18* (2013.01); *H01J 37/321* (2013.01); *H01J 37/32009* (2013.01); *H01J 37/32091* (2013.01); *H01J 37/32174* (2013.01);
(Continued)

(58) Field of Classification Search
CPC ... H03H 7/004; H01F 30/08; H01F 2005/027; H01F 38/18; H01F 38/14; H01F 27/00; H05H 2001/4675; H05H 2001/4652; H05H 1/24; H01L 21/3065; H01L 21/67069; H01J 37/32174; H01J 37/32091; H01J 37/321; H01J 37/32009; H01J 37/32082
See application file for complete search history.

(56) References Cited

U.S. PATENT DOCUMENTS

| | | | |
|---|---|---|---|
| 2,087,636 A * | 7/1937 | Baumann ........... | H01F 29/12 307/18 |
| 4,255,682 A | 3/1981 | Toida et al. | |

(Continued)

FOREIGN PATENT DOCUMENTS

| | | |
|---|---|---|
| CN | 103256930 A | 8/2013 |
| CN | 104349567 A | 2/2015 |

(Continued)

*Primary Examiner* — Rakesk K Dhingra
*Assistant Examiner* — Laureen Chan
(74) *Attorney, Agent, or Firm* — Nath, Goldberg & Meyer; Jerald L. Meyer

(57) ABSTRACT

A transformer includes: a rotary shaft configured to rotate about a central axis of the rotary shaft as a rotational axis; a primary-side first coil configured to extend around a first axis perpendicular to the central axis; a secondary-side second coil configured to extend around a second axis and supported by the rotary shaft, the second axis being perpendicular to the rotational axis in an area surrounded by the first coil; and a secondary-side third coil configured to extend around a third axis and supported by the rotary shaft, the third axis being perpendicular to the rotational axis and forming a predetermined angle with the second axis in the area.

24 Claims, 22 Drawing Sheets

(51) Int. Cl.
*H01L 21/67* (2006.01)
*H01L 21/3065* (2006.01)
(52) U.S. Cl.
CPC .... *H01L 21/3065* (2013.01); *H01L 21/67069* (2013.01); *H03H 7/004* (2013.01)

(56) References Cited

U.S. PATENT DOCUMENTS

| | | | | |
|---|---|---|---|---|
| 4,612,527 | A | * | 9/1986 | Third ................ H01F 38/18 336/119 |
| 5,147,493 | A | * | 9/1992 | Nishimura ........ H01J 37/32082 118/723 E |
| 5,519,275 | A | * | 5/1996 | Scott ................ F02B 63/04 310/112 |
| 5,783,984 | A | * | 7/1998 | Keuneke ............. H03H 7/38 336/155 |
| 6,118,201 | A | | 9/2000 | Dulin et al. |
| 2003/0037881 | A1 | | 2/2003 | Barnes et al. |
| 2009/0002111 | A1 | * | 1/2009 | Harrison ............. H01F 19/04 336/69 |
| 2010/0123451 | A1 | * | 5/2010 | Freer ................ H02J 5/005 323/356 |
| 2015/0115762 | A1 | * | 4/2015 | Rozman .............. G01D 5/2066 310/180 |
| 2015/0116065 | A1 | * | 4/2015 | Jeong ............... H01F 27/2804 336/65 |

FOREIGN PATENT DOCUMENTS

| | | |
|---|---|---|
| GB | 2 206 251 A | 12/1988 |
| JP | 4-48727 A | 2/1992 |
| JP | 3016821 B2 | 12/1999 |
| JP | 2002-343768 A | 11/2002 |
| KR | 10-2010-0131961 A | 12/2010 |

* cited by examiner

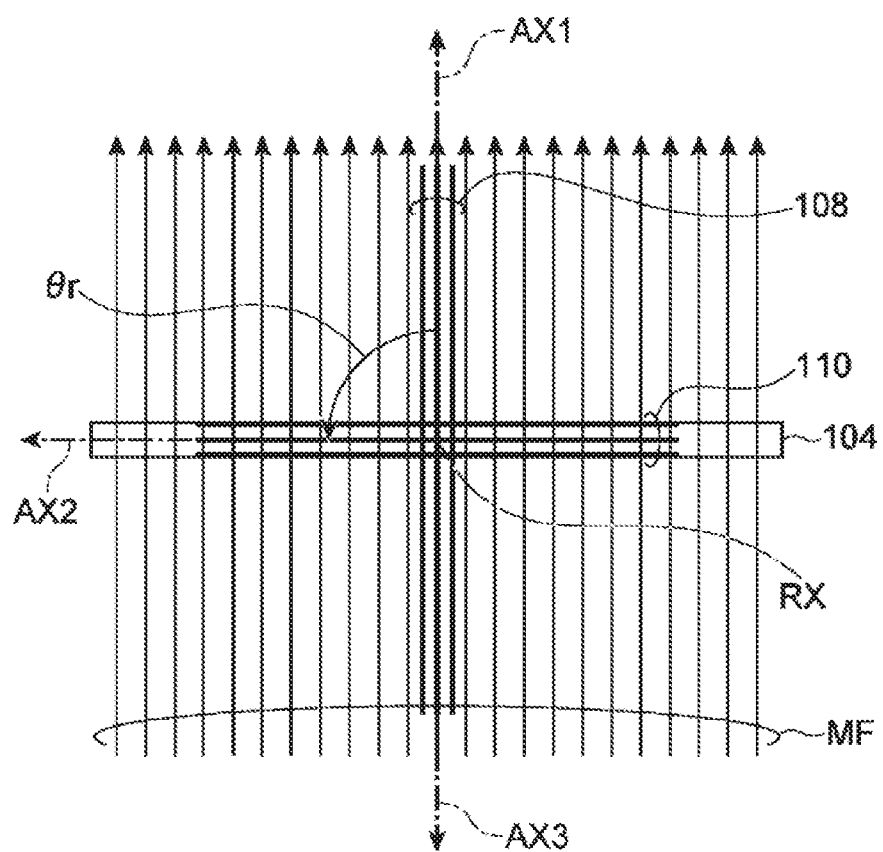

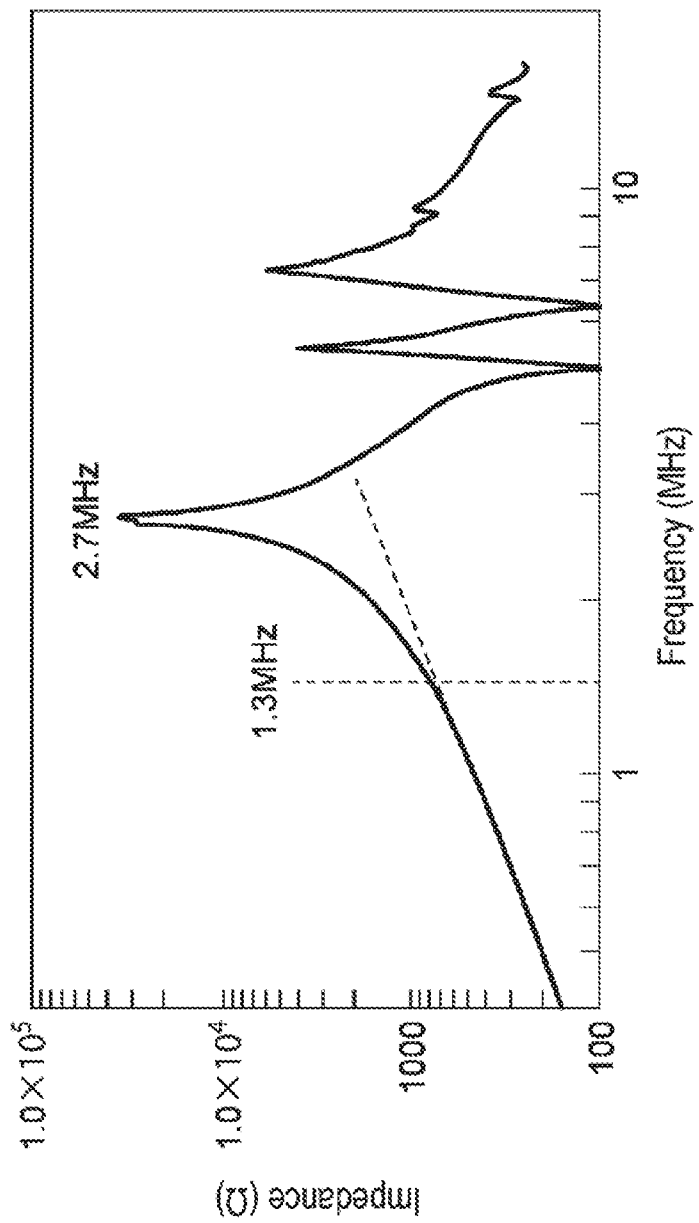

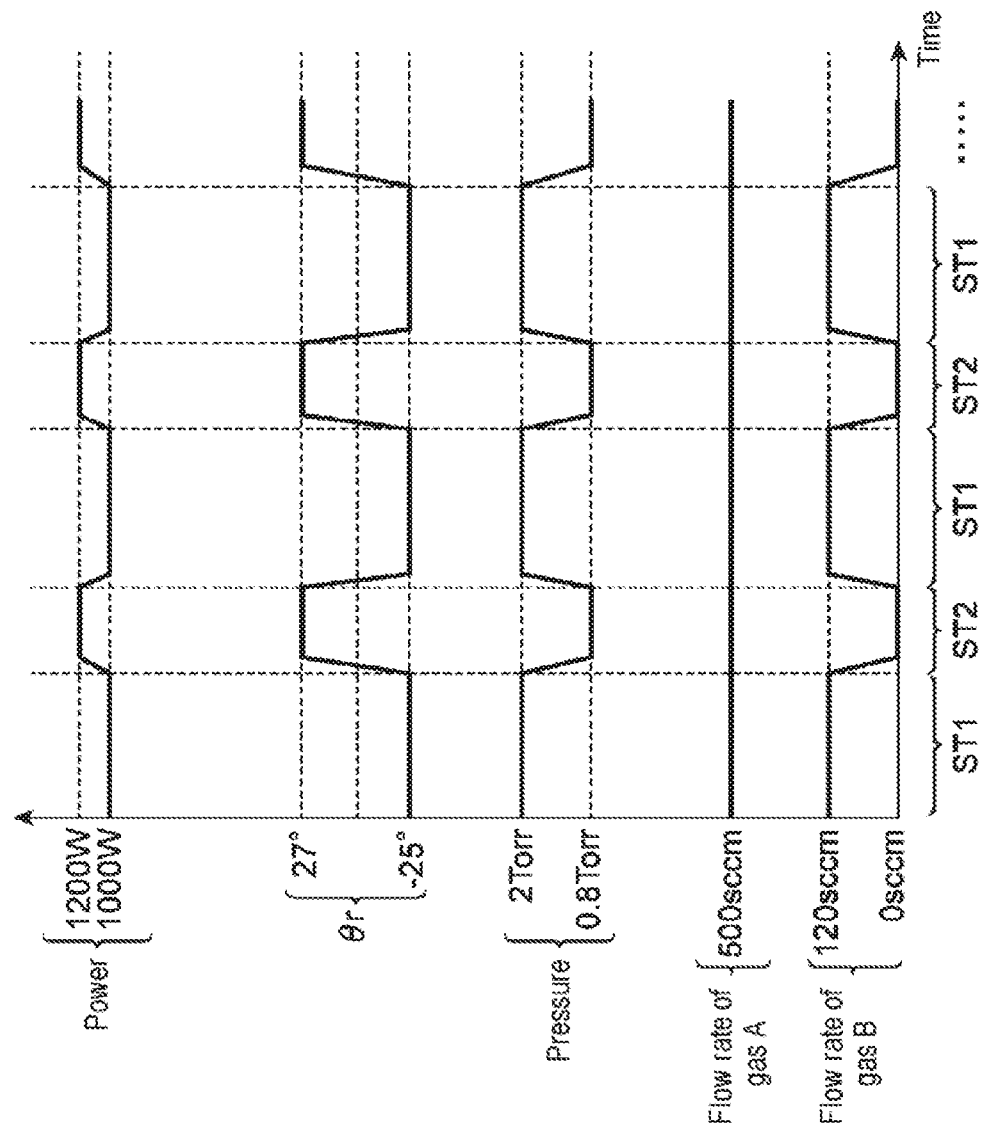

TRANSFORMER, PLASMA PROCESSING APPARATUS, AND PLASMA PROCESSING METHOD

CROSS-REFERENCE TO RELATED APPLICATION

This application claims the benefit of Japanese Patent Application No. 2016-089389, filed on Apr. 27, 2016, in the Japan Patent Office, the disclosure of which is incorporated herein in its entirety by reference.

TECHNICAL FIELD

Embodiments of the present disclosure relate to a transformer, a plasma processing apparatus, and a plasma processing method.

BACKGROUND

In the manufacturing of an electronic device such as a semiconductor device, a plasma processing apparatus is used for the processes of etching, film forming, and the like. A capacitively coupled plasma processing apparatus is known as a kind of a plasma processing apparatus. In general, the capacitively coupled plasma processing apparatus includes a chamber main body, an upper electrode, and a lower electrode. The upper electrode and the lower electrode are disposed such that a space in a chamber, which is defined by the chamber main body, is interposed therebetween. In such a plasma processing apparatus, a gas is supplied into the chamber, and a high-frequency electric field is generated between the upper electrode and lower electrode. The gas is excited by the high-frequency electric field to generate plasma. A workpiece is processed by means of ions and/or radicals from the plasma.

As the capacitively coupled plasma processing apparatus, a plasma processing apparatus that uses two high-frequency power sources and a plasma processing apparatus that uses a single high-frequency power source are known. In the former apparatus, i.e., the plasma processing apparatus that uses two high-frequency power sources, a first high-frequency power source is connected to the upper electrode or the lower electrode while a second high-frequency power source is connected to the lower electrode. The second high-frequency power source generates a high-frequency power having a frequency lower than that of a high-frequency power generated by the first high-frequency power source.

Meanwhile, a transformer is used in the latter apparatus, i.e., the plasma processing apparatus that uses a single high-frequency power source. A primary-side coil of the transformer is connected to the high-frequency power source. One end of a secondary-side coil is connected to an upper electrode, and the other end of the secondary-side coil is connected to a lower electrode. The secondary-side coil includes a plurality of tabs. In such a plasma processing apparatus, it is possible to select a ratio of a first high-frequency power output from one end of the secondary-side coil to a second high-frequency power output from the other end of the secondary-side coil by selecting a ground tab from the plurality of tabs.

In the related art, a division ratio of the secondary-side coil of a transformer is selected according to the selection of the tab. Accordingly, a selectable ratio of the first high-frequency power to the second high-frequency power, i.e., a selectable power ratio of two output high-frequency powers, is large and discrete. Thus, it is impossible to minutely control the power ratio of two output high-frequency powers. In addition, it is impossible to change the power ratio of two output high-frequency powers in a state in which a high-frequency power is supplied to the primary-side coil. Furthermore, it is impossible to switch a phase difference between the first high-frequency power and the second high-frequency power from in-phase to antiphase or vice versa.

SUMMARY

According to a first aspect of the present disclosure, there is provided a transformer including: a rotary shaft configured to rotate about a central axis of the rotary shaft as a rotational axis; a primary-side first coil configured to extend around a first axis perpendicular to the central axis; a secondary-side second coil configured to extend around a second axis and supported by the rotary shaft, the second axis being perpendicular to the rotational axis in an area surrounded by the first coil; and a secondary-side third coil configured to extend around a third axis and supported by the rotary shaft, the third axis being perpendicular to the rotational axis and forming a predetermined angle with the second axis in the area.

According to a second aspect of the present disclosure, there is provided a capacitively coupled plasma processing apparatus including: a chamber main body configured to provide a chamber; a first electrode as an upper electrode; a second electrode as a lower electrode; a high-frequency power source; and a transformer of the first aspect, wherein the high-frequency power source is electrically connected to the first coil, the first electrode is electrically connected to one end of the second coil, and the second electrode is electrically connected to one end of the third coil.

According to a third aspect of the present disclosure, there is provided a capacitively coupled plasma processing apparatus including: a chamber main body configured to provide a chamber; an upper electrode; a lower electrode; a high-frequency power source; and a transformer of the first aspect, wherein the upper electrode includes a first electrode intersecting with a central line of the chamber, the central line extending in a vertical direction, and a second electrode installed in an outer side of the first electrode in a radial direction with respect to the central line, the high-frequency power source is electrically connected to the first coil, the first electrode is electrically connected to one end of the second coil, and the second electrode is electrically connected to one end of the third coil.

According to a fourth aspect of the present disclosure, there is provided a capacitively coupled plasma processing apparatus including: a chamber main body configured to provide a chamber; a first electrode as an upper electrode; a lower electrode; a second electrode installed to be closer to a side wall of the chamber main body than the upper electrode; a high-frequency power source; and a transformer of the first aspect, wherein the high-frequency power source is electrically connected to the first coil, the first electrode is electrically connected to one end of the second coil, and the second electrode is electrically connected to one end of the third coil.

According to a fifth aspect of the present disclosure, there is provided a capacitively coupled plasma processing apparatus including: a first processing compartment configured to provide a first processing space; a second processing compartment configured to provide a second processing space; a first upper electrode and a first lower electrode installed such that a space in the first processing space is interposed therebetween; a second upper electrode and a second lower electrode installed such that a space in the second processing space is interposed therebetween; a high-frequency power source; and a transformer of the first aspect, wherein the high-frequency power source is electrically connected to the first coil, a first electrode, which is one of the first upper electrode and the first lower electrode, is electrically connected to one end of the second coil, and a second electrode, which is one of the second upper electrode and the second lower electrode, is electrically connected to one end of the third coil.

According to a sixth aspect of the present disclosure, there is provided a capacitively coupled plasma processing apparatus including: a first processing compartment configured to provide a first processing space; a second processing compartment configured to provide a second processing space; a first upper electrode and a first lower electrode installed such that a space in the first processing space is interposed therebetween; a second upper electrode and a second lower electrode installed such that a space in the second processing space is interposed therebetween; a high-frequency power source; and a transformer of the first aspect, wherein the high-frequency power source is electrically connected to the first coil, a first electrode as the first upper electrode is electrically connected to one end of the second coil, a second electrode as the second upper electrode is electrically connected to the other end of the second coil, a third electrode as the first lower electrode is electrically connected to one end of the third coil, and a fourth electrode as the second lower electrode is electrically connected to the other end of the third coil.

According to a seventh aspect of the present disclosure, there is provided a capacitively coupled plasma processing apparatus including: a first processing compartment configured to provide a first processing space; a second processing compartment configured to provide a second processing space; a first upper electrode and a first lower electrode installed such that a space in the first processing space is interposed therebetween; a second upper electrode and a second lower electrode installed such that a space in the second processing space is interposed therebetween; a high-frequency power source; and a transformer of the first aspect, wherein the high-frequency power source is electrically connected to the first coil, a first electrode as the first upper electrode is electrically connected to one end of the second coil, a second electrode as the first lower electrode is electrically connected to the other end of the second coil, a third electrode as the second upper electrode is electrically connected to one end of the third coil, and a fourth electrode as the second lower electrode is electrically connected to the other end of the third coil.

According to an eighth aspect of the present disclosure, there is provided an inductively coupled plasma processing apparatus including: a chamber main body configured to provide a chamber; a lower electrode installed in the chamber; a window member installed above the lower electrode; a first antenna coil installed above the window member and configured to extend around a central line of the chamber, the central line extending in a vertical direction; a second antenna coil installed above the window member and configured to extend around the central line, the second antenna coil being installed in an outer side of the first antenna coil; a high-frequency power source; and a transformer of the first aspect, wherein the high-frequency power source is electrically connected to the first coil, one end and the other end of the second coil are electrically connected to one end and the other end of the first antenna coil, respectively, and one end and the other end of the third coil are electrically connected to one end and the other end of the second antenna coil, respectively.

According to a ninth aspect of the present disclosure, there is provided an inductively coupled plasma processing apparatus including: a chamber main body configured to provide a chamber; a lower electrode installed in the chamber; a window member installed above the lower electrode; an antenna coil installed above the window member; a high-frequency power source; and a transformer of the first aspect, wherein the high-frequency power source is electrically connected to the first coil, one end and the other end of the second coil are electrically connected to one end and the other end of the antenna coil, respectively, and one end of the third coil is electrically connected to the lower electrode.

According to a tenth aspect of the present disclosure, there is provided a plasma processing method using any one of the plasma processing apparatuses of the second to the firth aspects in which the other end of the second coil and the other end of the third coil are connected to each other and grounded, the method comprising: setting an angular position of a pair of secondary-side coils, which includes the second coil and the third coil, in an rotational direction to be a first angular position; and setting the angular position of the pair of secondary-side coils in the rotational direction to be a second angular position, wherein the act of setting the angular position to be the first angular position and the act of setting the angular position to be the second angular position are alternately repeated while a high-frequency power is supplied from the high-frequency power source to the first coil.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a plan view schematically illustrating the transformer of FIG. 1.

FIG. 8 is a graph showing impedance characteristics.

FIG. 12 is a timing chart in relation to a plasma processing method according to an embodiment.

DETAILED DESCRIPTION

Figure 1:
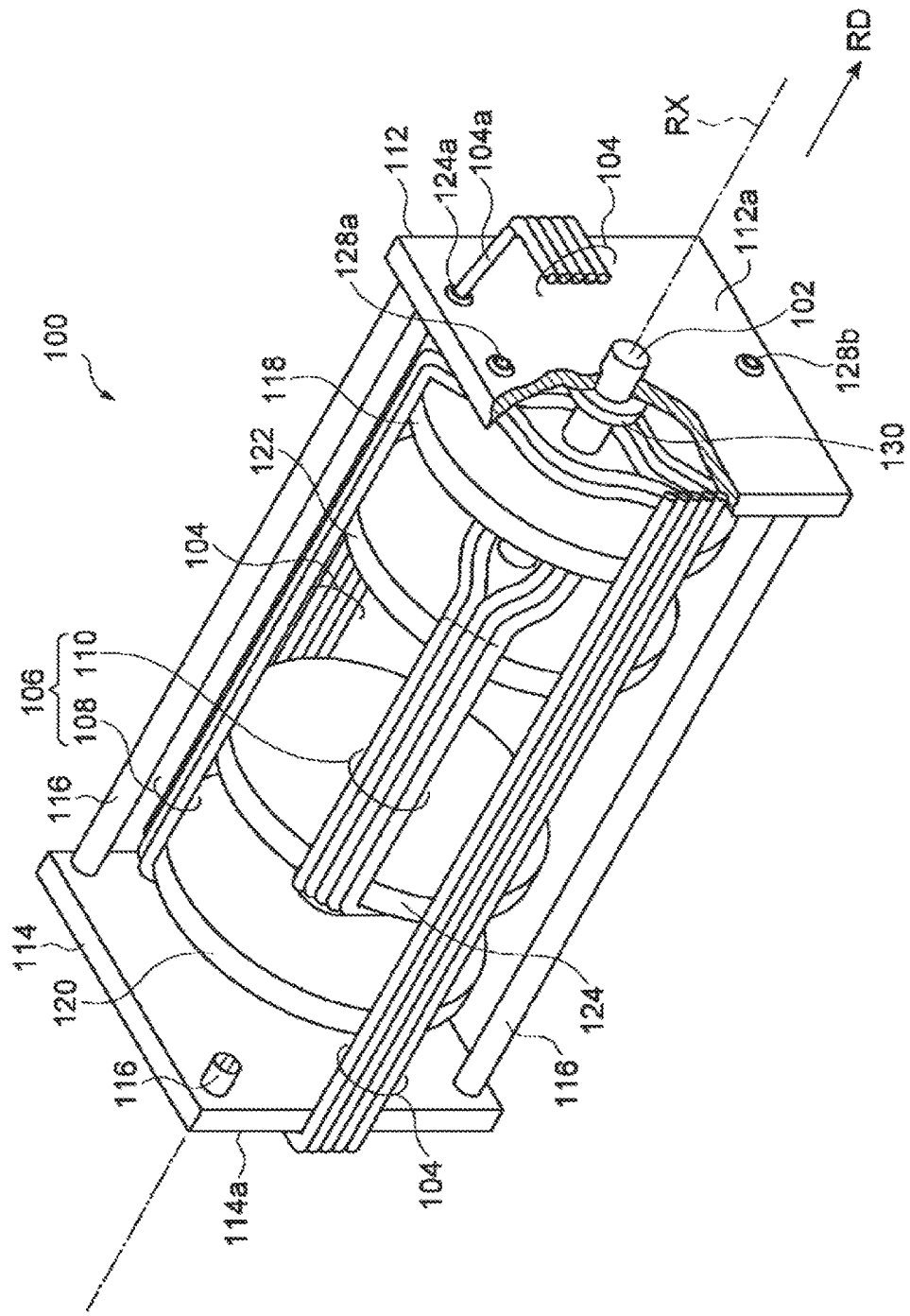
FIG. 1 is a partially cutaway perspective view of a transformer according to an embodiment.

Hereinafter, various embodiments will be described in detail with reference to the drawings. In addition, the same component or an equivalent component will bear the same reference numeral in the drawings.

Figure 2:
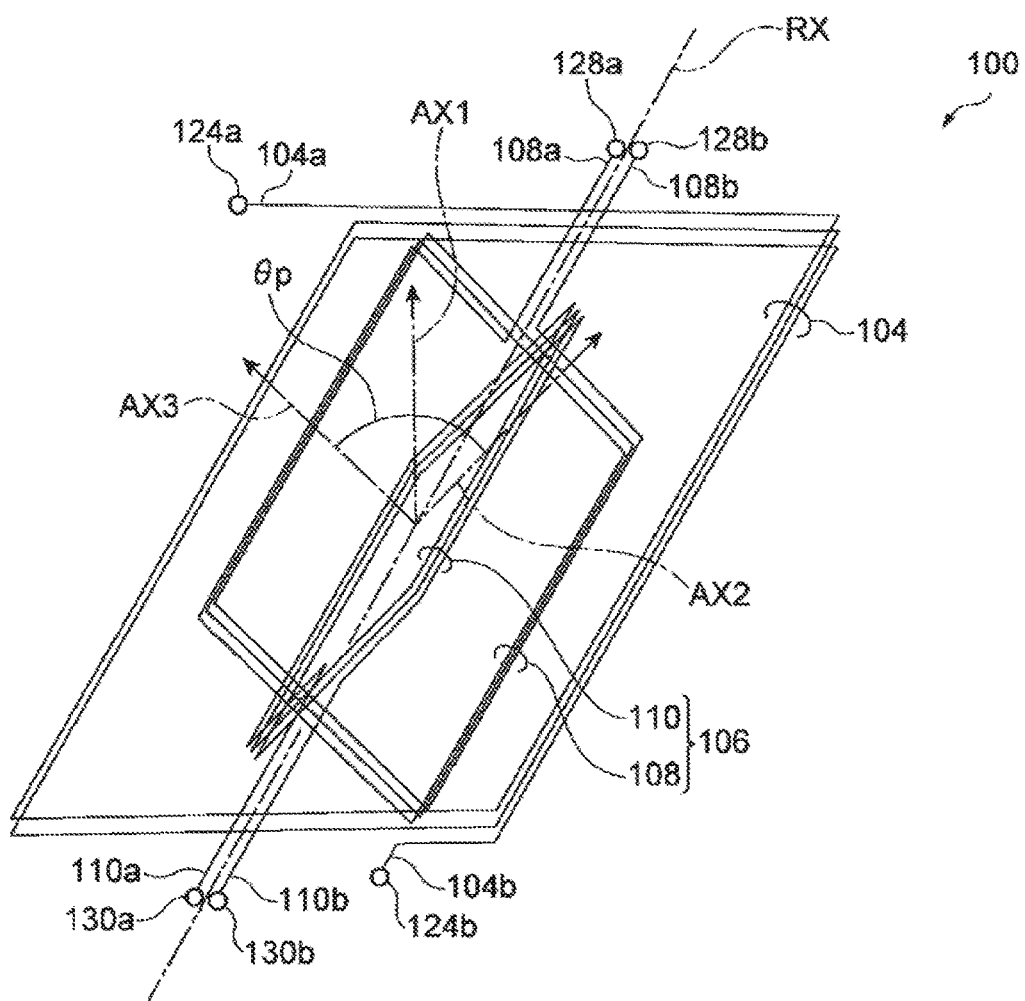
FIG. 2 is a view schematically illustrating three coils of a transformer according to the embodiment.

FIG. 1 is a partially cutaway perspective view of a transformer according to an embodiment, and FIG. 2 schematically illustrates three coils of a transformer according to the embodiment. The transformer 100 shown in FIGS. 1 and 2 includes a rotary shaft 102, a primary-side first coil 104, and a pair of secondary-side coils 106. The pair of secondary-side coils 106 includes a second coil 108 and a third coil 110. In the embodiment, the transformer 100 further includes support members 112 and 114, support columns 116, support members 118 and 120, support members 122 and 124, terminals 124a and 124b, terminals 128a and 128b, and terminals 130a and 130b.

The rotary shaft 102 has a substantially cylindrical shape. The rotary shaft 102 is installed to be rotatable about a central axis RX thereof as a rotational axis. In the embodiment, the rotary shaft 102 is rotatably supported by the support members 112 and 114. The support members 112 and 114 are plate-shaped members and have a substantially planar rectangular shape. The support members 112 and 114 are made of an insulating material. The support members 112 and 114 are installed to intersect with or be substantially perpendicular to the central axis RX. The support members 112 and 114 are arranged along a direction RD, which is an extension direction of the central axis RX, such that a thickness direction of the support members 112 and 114 substantially coincides with the direction RD. One ends of the support columns 116 are fixed to corners of the support member 112, and the other ends of the support columns 116 are fixed to corners of the support member 114. One end of the rotary shaft 102 passes through the support member 112 to protrude from the support member 112. The one end of the rotary shaft 102 is connected to a driving mechanism 140, for example, a motor, which will be described later.

The support members 118 and 120 have a substantially disk shape, and are formed of an insulating material. The support members 118 and 120 are installed between the support member 112 and the support member 114 so as to intersect with or be substantially perpendicular to the central axis RX. The support members 118 and 120 are arranged along the direction RD such that a thickness direction thereof substantially coincides with the direction RD. In addition, the support members 122 and 124 have a substantially disk shape, and are formed of an insulating material. The support members 122 and 124 are installed between the support member 118 and the support member 120 so as to intersect with or be substantially perpendicular to the central axis RX. The support members 122 and 124 are arranged along the direction RD such that a thickness direction thereof substantially coincides with the direction RD. The rotary shaft 102 passes through the centers of the support members 118, 120, 122, and 124, respectively. The support members 118, 120, 122, and 124 are fixed to the rotary shaft 102.

The first coil 104 extends around a first axis AX1 perpendicular to the central axis RX. In the embodiment, the first axis AX1 is perpendicular to the central axis RX in the middle between the support member 112 and the support member 114. The first coil 104 is wound around the center of the first axis AX1 so as to alternately pass through the outer side of the support member 112 and the outer side of the support member 114.

One end 104a of the first coil 104 is connected to the terminal 124a. In the embodiment, the terminal 124a is installed on one surface 112a of the support member 112 (a surface facing the outside of the transformer 100). In addition, the other end 104b of the first coil 104 is connected to the terminal 124b. In the embodiment, the terminal 124b is installed on one surface 14a of the support member 114 (a surface facing outside of the transformer 100).

The second coil 108 extends around a second axis AX2. The second axis AX2 is perpendicular to the central axis RX in an area surrounded by the first coil 104. In the embodiment, the second axis AX2 is perpendicular to the central axis RX in the middle between the support member 118 and the support member 120. The second coil 108 is wound around the center of the second axis AX2 so as to alternately pass through the outer side of the support member 118 and the outer side of the support member 120. The second coil 108 is supported by the rotary shaft 102 while the support member 118 and the support member 120 are interposed therebetween.

One end 108a of the second coil 108 is connected to the terminal 128a In addition, the other end 108b of the second coil 108 is connected to the terminal 128b. In the embodiment, the terminals 128a and 128b are installed on the surface 112a of the support member 112. The rotary shaft 102 includes a first conductor and a second conductor which are installed coaxially. One end 108a of the second coil 108 is connected to the first conductor and the other end 108b of the second coil 108 is connected to the second conductor. The first conductor is connected to the terminal 128a through a slip ring in a rotary connector 130. The second conductor is connected to the terminal 128b through another slip ring in the rotary connector 130.

The third coil 110 extends around a third axis AX3. The third axis AX3 is perpendicular to the central axis RX in the area surrounded by the first coil 104. In addition, the third axis AX3 intersects with the second axis AX2. The third axis AX3 and the second axis AX2 form a predetermined angle θp therebetween. The angle θp is not limited particularly, but may be, for example, 90 degrees. In the embodiment, the third axis AX3 is perpendicular to the central axis RX in the middle between the support member 122 and the support member 124. The third coil 110 is wound around the center of the third axis AX3 so as to alternately pass through the outer side of the support member 122 and the outer side of the support member 124. The third coil 110 is supported by the rotary shaft 102 while the support member 122 and the support member 124 are interposed therebetween. An insulation distance is secured between the third coil 110 and the second coil 108.

One end 110a of the third coil 110 is connected to the terminal 130a. In addition, the other end 110b of the third coil 110 is connected to the terminal 130b. In the embodiment, the terminals 130a and 130b are installed on the surface 114a of the support member 114. The rotary shaft 102 includes a third conductor and a fourth conductor which are installed coaxially. One end 110a of the third coil 110 is connected to the third conductor and the other end 110b of the third coil 110 is connected to the fourth conductor. The third conductor is connected to the terminal 130a through a slip ring of a separate rotary connector that is installed in the vicinity of the support member 114. The fourth conductor is connected to the terminal 130b through another slip ring in the separate rotary connector.

Figure 3:
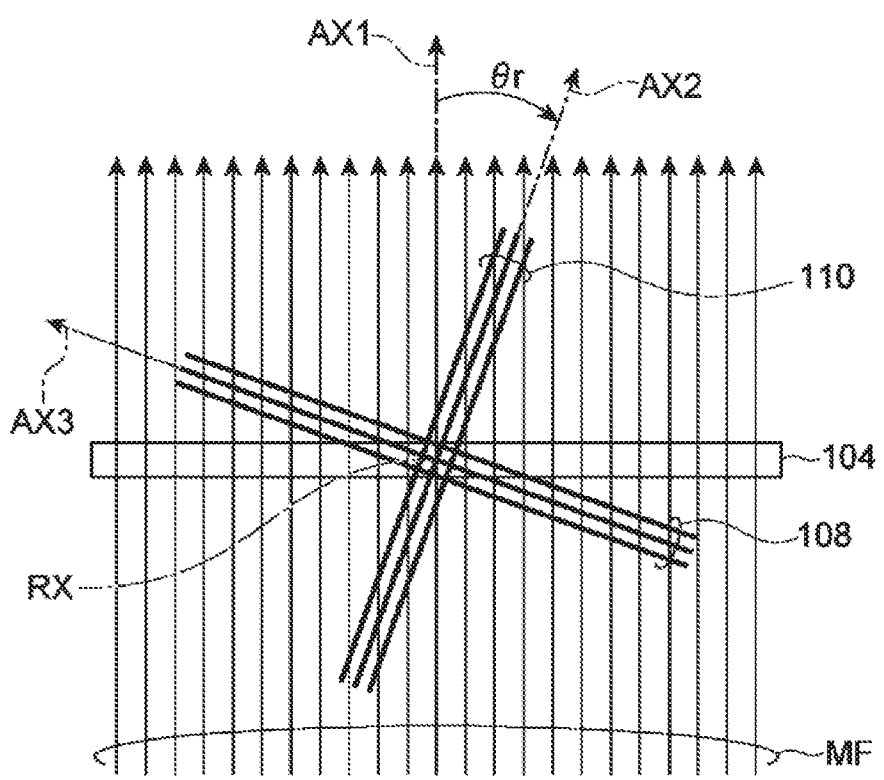
FIG. 3 is a plan view schematically illustrating the transformer of FIG. 1.
Figure 4:
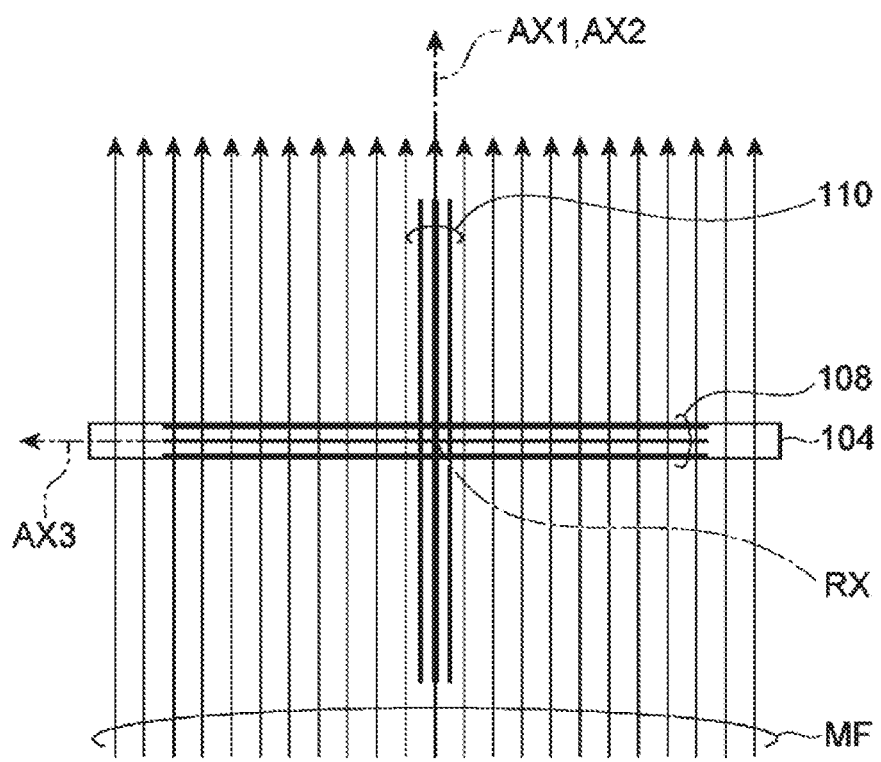
FIG. 4 is a plan view schematically illustrating the transformer of FIG. 1.
Figure 5:
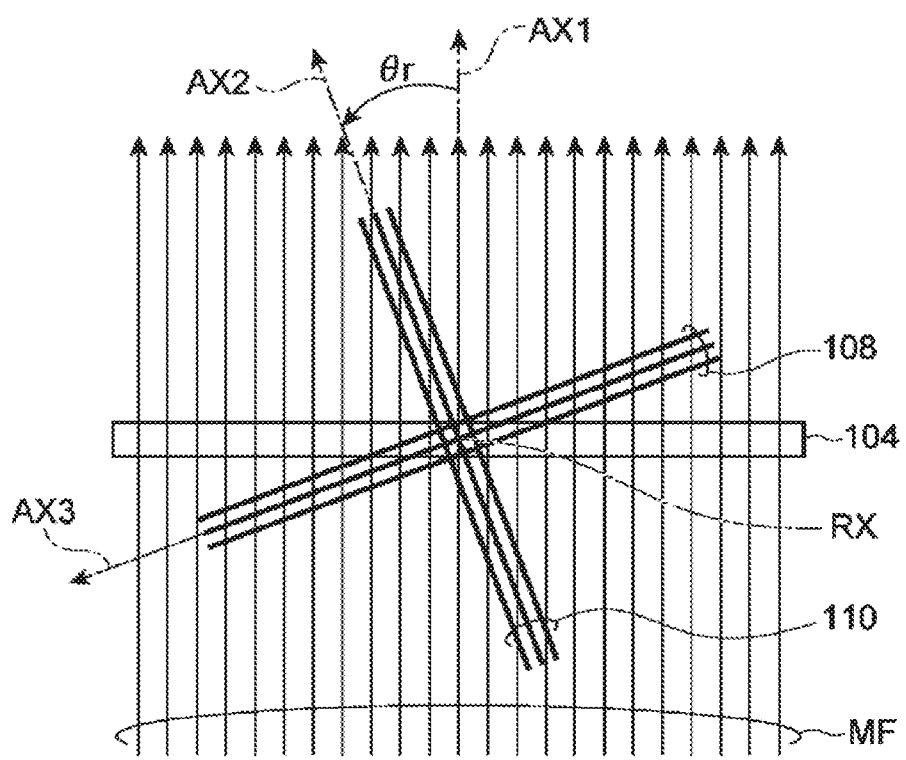
FIG. 5 is a plan view schematically illustrating the transformer of FIG. 1.

Hereinafter, the description will be made of the principles for generating two output high-frequency powers by means of the transformer 100 with reference to FIGS. 3 to 6. FIGS. 3 to 6 are plan views schematically showing the transformer shown in FIG. 1. FIGS. 3 to 6 schematically illustrate the first coil 104, the second coil 108, and the third coil 110 when viewed from a direction along the central axis RX. The first coil 104 is illustrated in a rectangular shape in FIGS. 3 to 6. In the following description, the angular position θr in the rotational direction of the pair of secondary-side coils 106 is defined as an angle formed by the first axis AX1 and the second axis AX2. As shown in FIG. 4, when the first axis AX1 and the second axis AX2 coincide with each other, the angular position θr is 0 degrees. In addition, as shown in FIG. 3, when the second axis AX2 deviates from the first axis AX1 by a range of 0 to 180 degrees in the clockwise direction, the angular position θr has a negative value. Furthermore, as shown in FIG. 5, when the second axis AX2 deviates from the first axis AX1 by a range of 0 to 180 degrees in the counterclockwise direction, the angular position θr has a positive value.

When a high-frequency power is supplied to the first coil 104 from a high-frequency power source, a magnetic flux MF is generated in a direction substantially parallel to the first axis AX1. As shown in FIG. 3, the generated magnetic flux passes through the second coil 108 so that an induced electromotive force is generated in the second coil 108. In addition, the generated magnetic flux passes through the third coil 110 so that an induced electromotive force is generated in the third coil 110. According to this configuration, the first high-frequency power is output from the second coil 108, and the second high-frequency power is output from the third coil 110. The amount of magnetic flux passing through the second coil 108 and further the first high-frequency power are dependent on the angle formed by the first coil 104 and the second coil 108. In addition, the amount of magnetic flux passing through the third coil 110 and further the second high-frequency power are dependent on the angle formed by the first coil 104 and the third coil 110. In the transformer 100, since the pair of secondary-side coils 106 can be rotated by the rotation of the rotary shaft 102, the ratio of the angle formed by the first coil 104 and the second coil 108 to the angle formed by the first coil 104 and the third coil 110 can be changed minutely. Thus, it is possible to minutely control the ratio of the first high-frequency power to the second high-frequency power, i.e., the power ratio of two output high-frequency powers.

In addition, the transformer 100 can change the power ratio of two output high-frequency powers by the rotation of the rotary shaft 102, instead of by changing the ground tab, i.e., a contact point. Therefore, even in a state in which a high-frequency power is supplied to the primary-side first coil 104, it is possible to change the power ratio of two output high-frequency powers.

In addition, the transformer 100 can switch a phase difference between the first high-frequency power and the second high-frequency power from in-phase to antiphase or vice versa. This will be described below in detail. In the state shown in FIG. 3, the angular position θr is, for example, −20 degrees. In this state, the magnetic flux penetrates through the second coil 108 from one side of the second coil 108 to the other side thereof, and penetrates through the third coil 110 from one side of the third coil 110 to the other side thereof. Thus, induced electromotive forces in the same direction (in-phase electromotive forces) are generated between one end and the other end of the second coil 108 and between one end and the other end of the third coil 110.

In the state shown in FIG. 4, the angular position θr is 0 degrees. In this state, the magnetic flux penetrates only through the second coil 108. Accordingly, induced electromotive force is generated only in the second coil 108, whereas no induced electromotive force is generated in the third coil 110.

In the state shown in FIG. 5, the angular position θr is, for example, 20 degrees. In this state, the magnetic flux penetrates through the second coil 108 from one side of the second coil 108 to the other side thereof, and penetrates through the third coil 110 from the other side of the third coil 110 to one side thereof. Thus, induced electromotive forces generated between one end and the other end of the second coil 108 and between one end and the other end of the third coil 110 have opposite directions (antiphase electromotive forces).

In the state shown in FIG. 6, the angular position θr is 90 degrees. In this state, the magnetic flux penetrates only through the third coil 110. Thus, an induced electromotive force is generated only in the third coil 110, whereas no induced electromotive force is generated in the second coil 108.

As described above, according to the transformer 100, the phase difference between the first high-frequency power and the second high-frequency power can be switched from in-phase to antiphase or vice versa. It is also possible to output a high-frequency power from only one of the second coil 108 and the third coil 110.

The following description will be made of design guidelines desired for improving the performance of the transformer 100. However, the transformer 100 is not limited to the design guidelines described below.

In the transformer, it is required that the current value in the primary-side coil has approximately the same level as that in the secondary-side coil. Here, in a case where a high-frequency power source is connected to the primary-side coil and a load of a complex impedance Z2 is connected to the secondary-side coil, a ratio (current ratio) of a current value I1 in the primary-side coil to a current value I2 in the secondary-side coil is expressed as Equation 1 below. In Equation 1, L1 is a self-inductance of the primary-side coil; L2 is a self-inductance of the secondary-side coil; k is a coupling coefficient between the primary-side coil and the secondary-side coil; and ω is an angular frequency of a high-frequency power.

$$\frac{I_2}{I_1} = \frac{ik\sqrt{L_1 L_2}\,\omega}{Z_2 + iL_2\omega} \approx k\sqrt{\frac{L_1}{L_2}} \quad \text{[Equation 1]}$$

In Equation 1, in order to increase the current ratio without depending on the complex impedance Z2 of the load, it is necessary to set the size or the number of windings of the secondary-side coil so as to satisfy $Z_2 \ll L_2\omega$. Therefore, in the embodiment, a coil having an inductance larger than a load impedance of a load connected to the second coil 108 is used as the second coil 108. Further, the third coil 110 uses a coil having an inductance larger than a load impedance of a load connected to the third coil 110 is used as the third coil 110.

In a case where the secondary-side coil satisfies $Z_2 \ll L_2\omega$, the current ratio, as shown in Equation 1, approximates a product of the coupling coefficient k and a square root of the ratio of the self-inductance L1 to the self-inductance L2. As can be seen from Equation 1, the current ratio can be increased by setting the self-inductance L1 of the primary-side coil to be greater than the self-inductance L2 of the secondary-side coil. In the transformer 100 according to the embodiment, the self-inductance of the first coil 104 is set to be greater than the self-inductance of the second coil 108 and the self-inductance of the third coil 110. According to this configuration, it is possible to increase the current ratio. Therefore, it is possible to supply a sufficient amount of current to each of the loads connected to the two secondary-side coils, i.e., the second coil 108 and the third coil 110.

In the embodiment, the second coil 108 and the third coil 110 are installed in the inner side of the first coil 104. That is to say, the pair of secondary-side coils 106 is installed in the inner side of the first coil 104 such that the pair of secondary-side coils 106 rotates without interfering with the first coil 104. Thus, the size (cross-sectional area) of the first coil 104 is set to be larger than the size (cross-sectional area) of the second coil 108 and the size (cross-sectional area) of the third coil 110. Therefore, it is possible to set the self-inductance of the first coil 104 to be greater than the self-inductance of the second coil 108 and the self-inductance of the third coil 110.

Next, a frequency of a high-frequency power input to the first coil 104 of the transformer 100 will be described. Since a coil has a floating capacitance component, the coil has a frequency at which the coil makes a parallel resonance, i.e., a self-resonance frequency. In the parallel resonance state, the impedance is very high. In addition, the primary-side coil is influenced by the load impedance at the secondary-side. Therefore, in a case where a frequency of the high-frequency power is near the self-resonance frequency of the primary-side coil, the impedance significantly varies even with a slight variation in the load. As a result, it is likely that the impedance goes beyond the matching range of a matching device installed between the primary-side coil and the high-frequency power source. This situation can be avoided by using a high-frequency power source that generates a high-frequency power having a frequency of less than half the self-resonance frequency of the primary-side coil of. Therefore, in the embodiments of various plasma processing apparatuses described later, as the high-frequency power source connected to the first coil 104, a high-frequency power source is selected such that the self-resonance frequency of the first coil 104 is more than double the frequency of the high-frequency power generated by the high-frequency power source.

Next, the description will be made of the angle θp formed by the second coil 108 and the third coil 110 of the pair secondary-side of coils 106. In the embodiment, the angle θp formed by the second coil 108 and the third coil 110 is set to be 90 degrees. According to this configuration, since a mutual inductance between the second coil 108 and the third coil 110 can be set very small, it is possible to suppress the mutual interference between the second coil 108 and the third coil 110. As a result, it is possible to effectively generate high-frequency powers in the second coil 108 and the third coil 110. When the induced electromotive force generated in one of the second coil 108 and the third coil 110 becomes the maximum, the induced electromotive force generated in the other one of the second coil 108 and the third coil 110 becomes the minimum. Therefore, the controllability of the power ratio of two output high-frequency powers can be improved. In addition, the number of turns of the second coil 108 and the number of turns of the third coil 110 can be increased.

Next, the self-inductance of the second coil 108 and the self-inductance of the third coil 110 will be described. In terms of a variable range and operation of the matching device, it is required that the ratio (the maximum value of the current ratio) of the current value of the first coil 104 to the current value of the second coil 108 is substantially the same as the ratio (the maximum value of the current ratio) of the current value of the first coil 104 to the current value of the third coil 110. However, in the embodiment, the third coil 110 is installed in the inner side of the second coil 108. Thus, the size (the cross-sectional area) of the third coil 110 is smaller than the size (cross-sectional area) of the second coil 108. For this reason, there exists a difference between the maximum value of the coupling coefficient of the first coil 104 and the second coil 108 and the maximum value of the coupling coefficient of the first coil 104 and the third coil 110. In order to reduce the difference, in the embodiment, the transformer 100 is configured such that the third coil 110 has a smaller self-inductance than that of the second coil 108.

Hereinafter, the description will be made on an evaluation that was conducted for an example of the transformer. However, the present disclosure is not limited to the example. In the example, the cross-section of the first coil had a size of 11 mm×19 mm; the cross-section of the second coil had a size of 9 mm×14 mm; and the cross-section of the third coil had a size of 9 mm×9 mm. The angle θp formed by the second coil and the third coil was 90 degrees. The self-inductance of the first coil, the self-inductance of the second coil, and the self-inductance of the third coil were 76.1 µH, 30.1 µH, and 33.4 µH, respectively.

One end of the first coil was connected to a port 1 of a network analyzer; one end of the second coil was connected to a port 2 of the network analyzer; a load of 50Ω was connected to one end of the third coil; and the other end of the first coil, the other end of the second coil, and the other end of the third coil were grounded. Then, the power transfer efficiency from the first coil to the second coil and the ratio of an input voltage of the first coil to an output voltage of the second coil (Vout/Vin) were measured while setting the angular position θr in the rotational direction of the pair of secondary-side coils to several values between −90 degrees to 90 degrees. In addition, one end of the first coil was connected to the port 1 of the network analyzer; one end of the third coil was connected to the port 2 of the network analyzer; a load of 50Ω was connected to one end of the second coil; and the other end of the first coil, the other end of the second coil, and the other end of the third coil were grounded. Then, the power transfer efficiency from the first coil to the third coil and the ratio of an input voltage of the first coil to an output voltage of the third coil (Vout/Vin) were measured while setting the angular position θr in the rotational direction of the pair of secondary-side coils to several values between −90 degrees to 90 degrees.

Figure 7A:
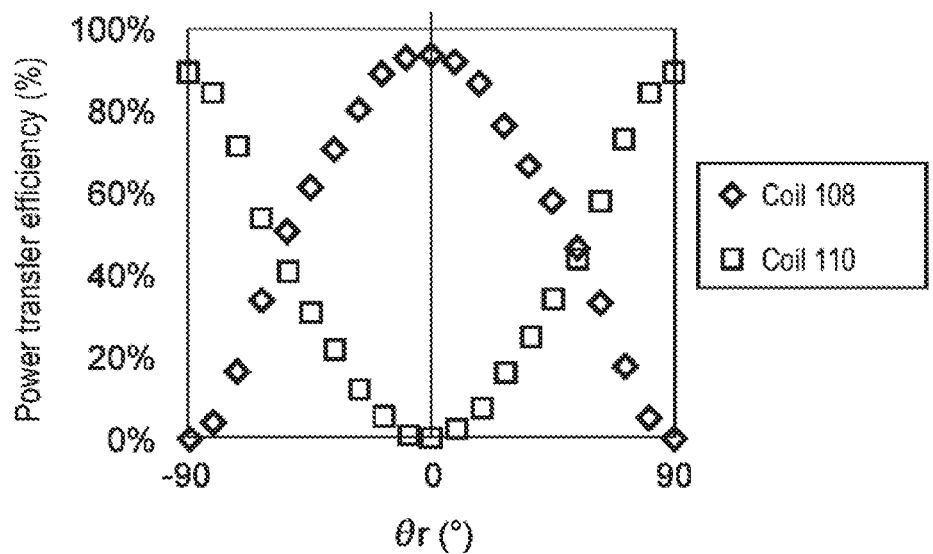
FIG. 7A is a graph showing the power transfer efficiency.
Figure 7B:
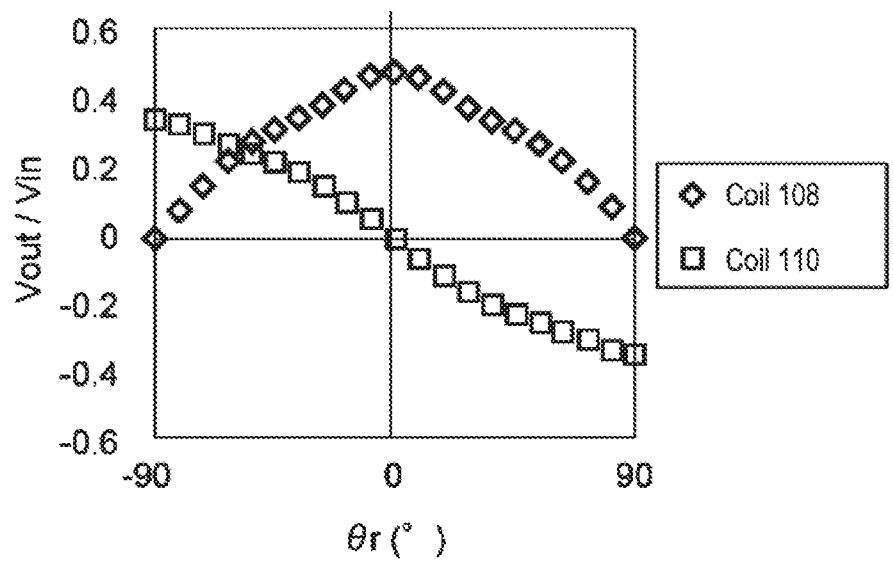
FIG. 7B is a graph showing a ratio of an input voltage to an output voltage (Vout/Vin).

The results are shown in FIGS. 7A and 7B. In the graph of FIG. 7A, the horizontal axis represents the angular position θr, and the vertical axis represents the power transfer efficiency (%). In the graph of FIG. 7A, the plots indicated by the legend of "Coil 108" represent the power transfer efficiency from the first coil to the second coil, and the plots indicated by the legend of "Coil 110" represent the power transfer efficiency from the first coil to the third coil. In the graph of FIG. 7B, the horizontal axis represents the angular position θr, and the vertical axis represents Vout/Vin. In the graph of FIG. 7B, the plots indicated by the legend of "Coil 108" represent the ratio of the input voltage of the first coil to the output voltage of the second coil, and the plots indicated by the legend of "Coil 110" represent the ratio of the input voltage of the first coil to the output voltage of the third coil.

As can be seen from the graph of FIG. 7A, according to the transformer of the example, it was confirmed that the power ratio of two output high-frequency powers can be minutely controlled by adjusting the angular position θr of the pair of secondary-side coils. In addition, as can be seen from the graph of FIG. 7B, it was confirmed that induced electromotive forces of the same direction (in-phase electromotive forces) are generated in the second coil and the third coil when the angular position θr of the pair of secondary-side coils is set between 0 degrees to −90 degrees, and induced electromotive forces of opposite directions (antiphase electromotive forces) are generated in the second coil and the third coil when the angular position θr of the pair of secondary-side coils is set between 0 degrees to 90 degrees. Therefore, it was confirmed that, according to the transformer of the example, it is possible to switch a phase relationship of two output high-frequency powers between in-phase and antiphase.

In addition, one end of the first coil was connected to the port 1 of the network analyzer; a load of 50Ω was connected to one end of the second coil and one end of the third coil, respectively; and the other end of the first coil, the other end of the second coil, and the other end of the third coil were grounded. Then, characteristics of the input-side impedance were measured. The results are shown in FIG. 8. In the graph of FIG. 8, the horizontal axis represents the frequency, and the vertical axis represents the input-side impedance. As can be seen from the graph of FIG. 8, in the transformer of the example, the input-side impedance is linearly changed on the logarithmic graph with an increase in the frequency up to about 1.3 MHz. This is a normal behavior of a coil. In the transformer of the example, if the frequency exceeds about 1.3 MHz; the input-side impedance rapidly increases and a parallel resonance occurs at a frequency of 2.7 MHz. Therefore, it was confirmed that it is preferable to select a high-frequency power source connected to the first coil such that the self-resonance frequency of the first coil is more than double the frequency of the high-frequency power generated by the high-frequency power source. A high frequency of 450 kHz was used in the above-described evaluation in relation to FIGS. 7A and 7B.

Hereinafter, some examples of the plasma processing apparatus equipped with the transformer 100 will be described.

Figure 9:
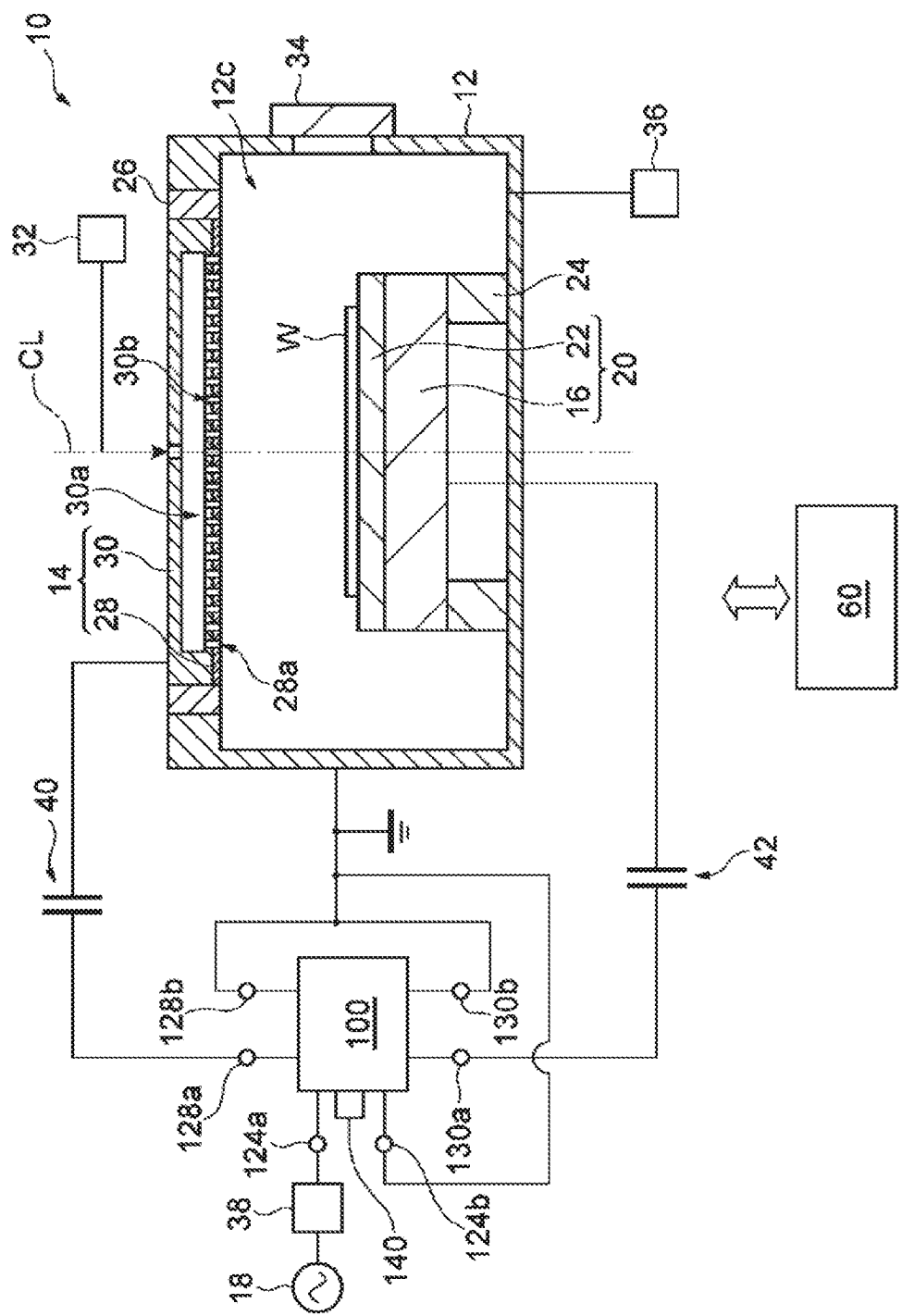
FIG. 9 illustrates a plasma processing apparatus according to a first embodiment.
Figure 10:
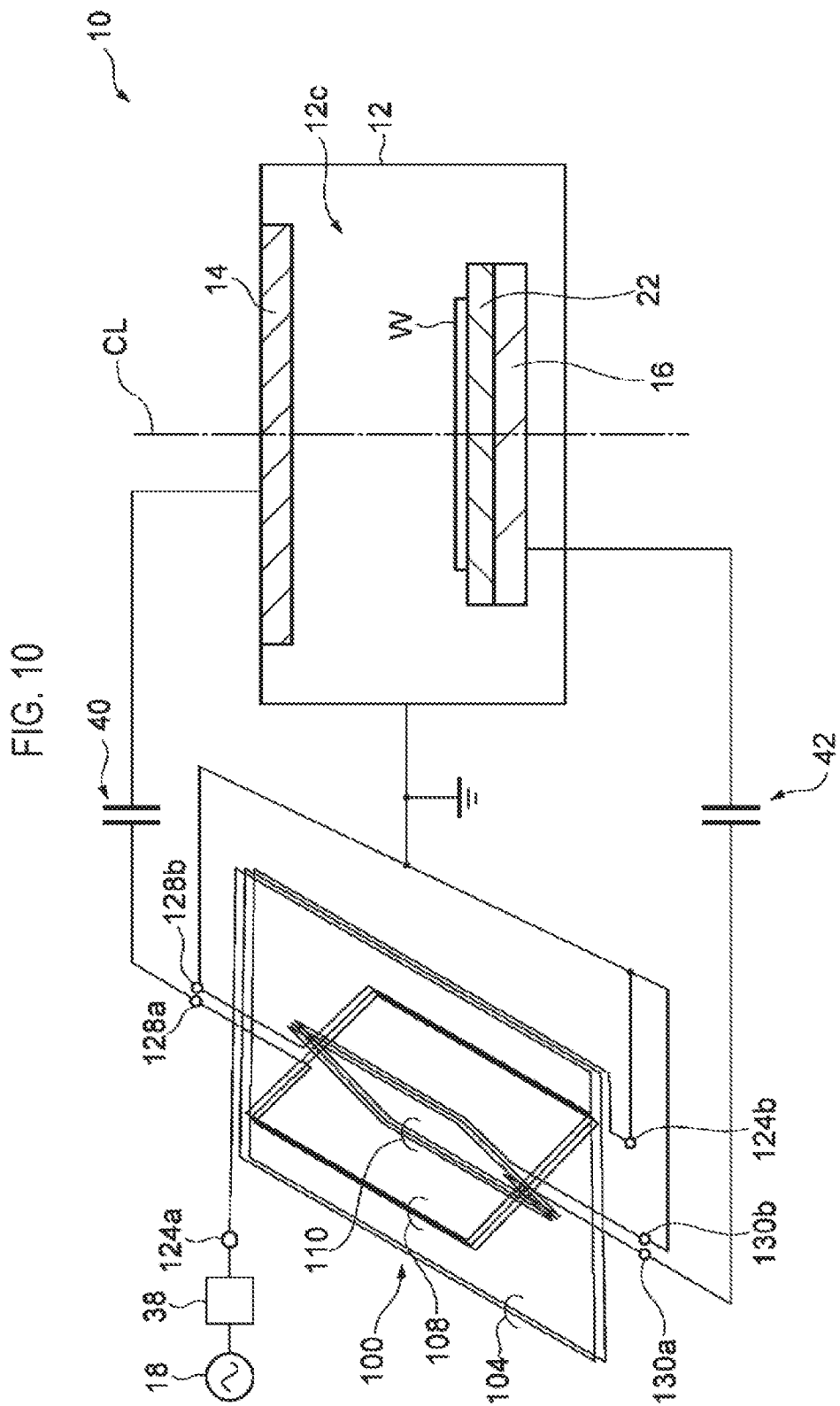
FIG. 10 illustrates a plasma processing apparatus according to the first example.

FIGS. 9 and 10 are views illustrating a plasma processing apparatus according to a first embodiment. FIG. 9 shows a plasma processing apparatus according to the first embodiment with its chamber main body cut away. FIG. 10 schematically shows the plasma processing apparatus of FIG. 9 and the first to third coils of the transformer. The plasma processing apparatus 10 shown in FIGS. 9 and 10 is a capacitively coupled plasma processing apparatus and includes a chamber main body 12, an upper electrode 14, a lower electrode 16, a high-frequency power source 18, and a transformer 100.

The inner space of the chamber main body 12 is provided as a chamber 12c. The chamber main body 12 is formed of a metal such as aluminum. A plasma resistant coating is formed on the inner wall surface of the chamber main body 12. The plasma resistant coating may be a ceramic film such as an alumite film or an yttrium oxide film. The chamber main body 12 includes a side wall portion having a substantially cylindrical shape, a bottom portion extending from the lower end of the side wall portion, and an upper end portion extending from the upper end of the side wall portion. The chamber main body 12 is grounded.

A stage 20 is installed in the chamber main body 12. The stage 20 includes the lower electrode 16. In the embodiment, the stage 20 further includes an electrostatic chuck 22. The stage 20 is supported by an insulation support body 24 extending from the bottom portion of the chamber main body 12. The lower electrode 16 of the stage 20 corresponds to a second electrode in the first embodiment. The lower electrode 16 has a substantially disc shape, and is formed of a conductor such as aluminum. The electrostatic chuck 22 is installed on the lower electrode 16. The electrostatic chuck 22 includes a dielectric film and an electrode embedded in the dielectric film. The electrode of the electrostatic chuck 22 is connected to a power source through a switch. When a voltage is applied to the electrode of the electrostatic chuck 22 from the power source, the electrostatic chuck 22 generates an electrostatic force. The electrostatic chuck 22 attracts and holds a workpiece W mounted thereon by the electrostatic force.

The upper end portion of the chamber main body 12 has an opening. The upper electrode 14 is supported on the upper end portion of the chamber main body 12 with an insulation member 26 interposed therebetween. The upper electrode 14 together with the member 26 closes the opening of the upper end portion of the chamber main body 12. The upper electrode 14 corresponds to a first electrode in the first embodiment. A space in the chamber 12c is formed between the upper electrode 14 and the lower electrode 16. The upper electrode 14 includes a ceiling plate 28 and a support body 30. The ceiling plate 28 faces the chamber 12c. The ceiling plate 28 may be formed of a material such as silicon, aluminum, or quartz. In the case where the ceiling plate 28 is formed of aluminum, a plasma resistant coating is formed on the surface thereof. A plurality of gas discharge holes 28a is formed in the ceiling plate 28.

The support body 30 detachably supports the ceiling plate 28. The support body 30 is formed of a conductor such as aluminum. A gas diffusion chamber 30a is formed in the support body 30. A plurality of holes 30b is formed in the support body 30 so as to communicate the gas diffusion chamber 30a with the plurality of gas discharge holes 28a. In addition, the gas diffusion chamber 30a is connected to a gas supply part 32 for supplying a plasma processing gas. The gas supply part 32 includes a plurality of gas sources, a plurality of flow controllers such as a mass flow controller, and a plurality of valves. Each of the plurality of gas sources is connected to the gas diffusion chamber 30a through a corresponding one among the plurality of flow controllers and through a corresponding one among the plurality of valves. The gas supply part 32 adjusts a flow rate of a gas from a gas source selected among the plurality of gas sources, and supplies the gas to the gas diffusion chamber 30a. The gas supplied to the gas diffusion chamber 30a is supplied into the chamber 12c through the plurality of gas discharge holes 28a.

The side wall portion of the chamber main body 12 has an opening for a delivery of the workpiece. The opening is configured to be opened and closed by a gate valve 34. The chamber 12c is connected to an exhaust device 36. The pressure in the chamber 12c can be reduced by the exhaust device 36.

The rotary shaft 102 of the transformer 100 is connected to the driving mechanism 140, for example, a motor. The driving mechanism 140 generates a driving force to rotate the rotary shaft 102. The angular position θr of the pair of secondary-side coils 106 in the transformer 100 can be adjusted by the rotation of the rotary shaft 102.

The terminal 124a of the transformer 100 is connected to the high-frequency power source 18 through a matching device 38. Thus, one end of the first coil 104 is electrically connected to the high-frequency power source 18. The high-frequency power source 18 generates a high-frequency power supplied to the primary-side coil (the first coil 104) of the transformer 100. In the embodiment, the frequency of the high-frequency power may be less than half the self-resonant frequency of the first coil 104. The matching device 38 includes a matching circuit for matching the output impedance of the high-frequency power source 18 with the impedance of the load.

The terminal 128a of the transformer 100 is connected to the upper electrode 14 through a capacitor 40. Thus, one end of the second coil 108 is connected to the upper electrode 14. The terminal 130a of the transformer 100 is connected to the lower electrode 16 through a capacitor 42. Thus, one end of the third coil 110 is connected to the lower electrode 16. The terminals 124b, 128b, and 130b of the transformer 100 are connected with one another and grounded. Therefore, the other end of the first coil 104, the other end of the second coil 108, and the other end of the third coil 110 are connected with one another and grounded.

The plasma processing apparatus 10 further includes a control part 60. The control part 60 may be a computer device that includes various components such as a processor, a storage device such as a memory, a display device such as a display, an input device such as a keyboard, a data input/output device, and the like. The control part 60 is configured to control the components of the plasma processing apparatus 10 according to control programs and recipes stored in the storage device.

When the plasma processing apparatus 10 performs a plasma process, the workpiece W is held by the electrostatic chuck 22. A gas is supplied into the chamber 12c from the gas supply part 32. The pressure in the chamber 12c is reduced by the exhaust device 36. The gas supplied into the chamber 12c is excited by the output high-frequency power from the transformer 100. According to this configuration, plasma is generated in the chamber 12c. The workpiece W is processed by radicals and/or ions from the plasma.

A direct current potential of the plasma generated in the chamber 12c is higher than those of the chamber main body 12, the upper electrode 14, and the lower electrode 16. If the direct current potential of the lower electrode 16 is higher than those of the chamber main body 12 and the upper electrode 14, the energy of ions incident on the workpiece W decreases. On the contrary, if the direct current potential of the lower electrode 16 is lower than those of the chamber main body 12 and the upper electrode 14, the energy of ions incident on the workpiece W increases.

In the plasma processing apparatus 10, two high-frequency powers, i.e., a first high-frequency power and a second high-frequency power, generated based on the high-frequency power from the high-frequency power source 18 can be supplied to the upper electrode 14 and the lower electrode 16, respectively. Further, the magnitudes of the first high-frequency power and the second high-frequency power, and the phase difference between the first high-frequency power and the second high-frequency power can be adjusted by adjusting the angular position θr in the rotational direction of the pair of secondary-side coils 106. Therefore, it is possible to adjust the energy of ions incident on the workpiece W disposed above the lower electrode 16. For example, the angular position θr is set such that a current (high frequency current) in antiphase with respect to a current (high frequency current) introduced from the upper electrode 14 to the lower electrode 16 through the plasma is supplied to the lower electrode 16. Thereby, the energy of ions incident on the workpiece W disposed above the lower electrode 16 is suppressed.

Hereinafter, evaluation results on a current flowing through each of the upper electrode 14, the lower electrode 16, and the chamber main body 12 of the plasma processing apparatus 10 and a direct current potential of each of the upper electrode 14 and lower electrode 16 will be described. The distance between the upper electrode 14 and the lower electrode 16 of the plasma processing apparatus 10 used in the evaluation was 19 mm, and the plasma processing apparatus 10 was an apparatus capable of processing a wafer having a diameter of 300 mm. In this evaluation, the pressure in the chamber 12c was set to be 800 mTorr (106.7 Pa); the high-frequency power input to the first coil from the high-frequency power source was set to be 1000 W; and the frequency of the high-frequency power was set to be 450 kHz. Further, An Ar gas of 40 sccm and an $O_2$ gas of 40 sccm were supplied into the chamber 12c. The transformer described in the above-described embodiment above was used. In this evaluation, a current value of each of the upper electrode 14, the lower electrode 16, and the chamber main body 12 and a direct current potential Vdc of each of the upper electrode 14 and the lower electrode 16 were measured, while changing the angular position θr of the pair of secondary-side coils to several angular positions between −45 degrees and 45 degrees.

Figure 11A:
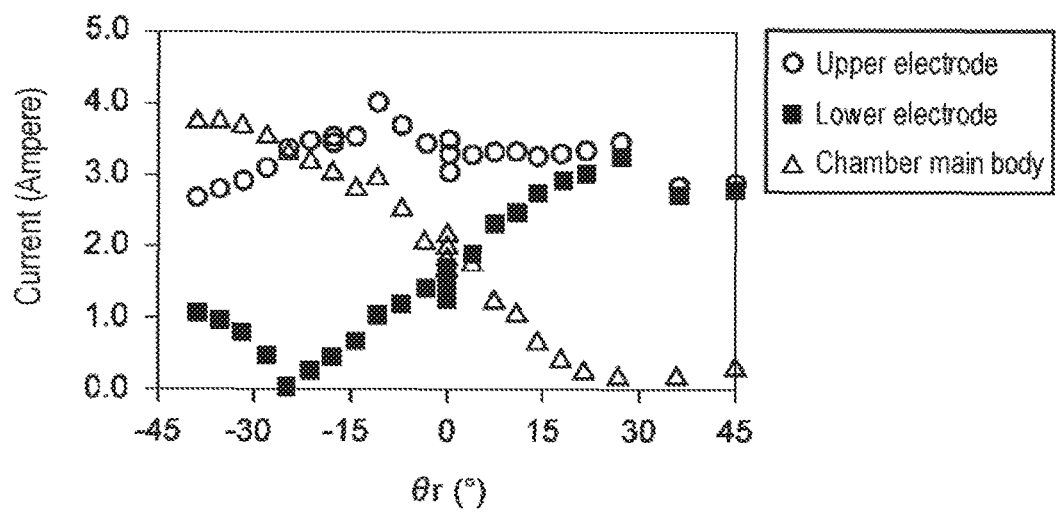
FIG. 11A is a graph showing current values in an upper electrode, a lower electrode, and a chamber main body, respectively.
Figure 11B:
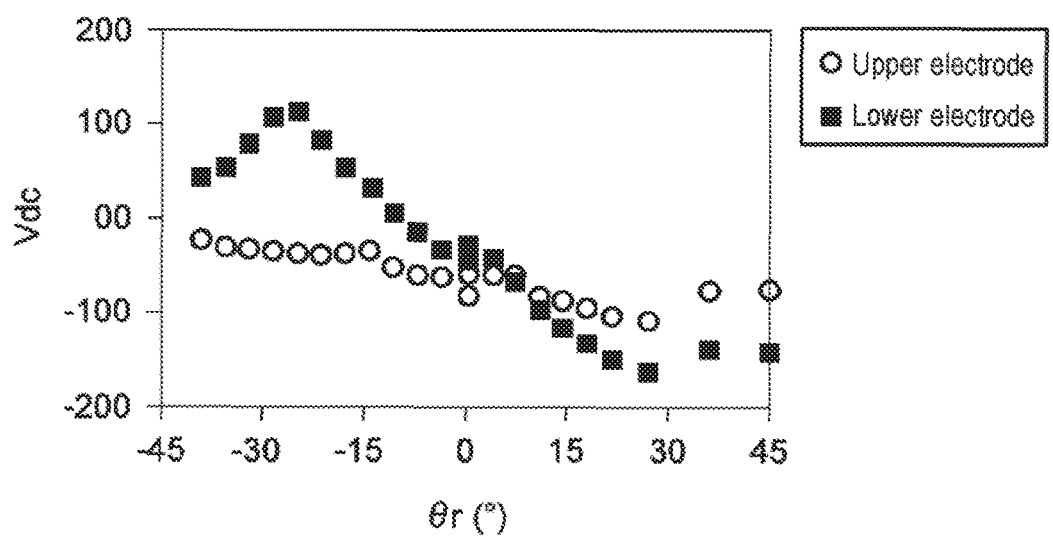
FIG. 11B is a graph showing direct current potentials of the upper electrode and the lower electrode, respectively.

FIG. 11A shows a relationship between the angular position θr and the current value of each of the upper electrode 14, the lower electrode 16, and the chamber main body 12, and FIG. 11B shows a relationship between the angular position θr and the direct current potential Vdc of each of the upper electrode 14 and the lower electrode 16. In the graph of FIG. 11A, the plots indicated by the legend of "Upper electrode" represents a current value in the upper electrode 14; the plots indicated by the legend of "Lower electrode" represents a current value in the lower electrode 16; and the plots indicated by the legend of "Chamber main body" represents a current value in the chamber main body 12. In the graph of FIG. 11B, the plots indicated by the legend of "Upper electrode" represents a direct current potential in the upper electrode 14, and the plots indicated by the legend of "Lower electrode" represents a direct current potential in the lower electrode 16. The evaluation results shown in FIGS. 11A and 11B will be described below based on a direction of the current flowing from the upper electrode 14 to the lower electrode 16 and the chamber main body 12 through the plasma.

When the angular position θr is 27 degrees, the first high-frequency power supplied to the upper electrode 14 is greater than the power supplied to the lower electrode 16. However, a part of the current from the upper electrode 14 is introduced to the lower electrode 16 and the second high-frequency power having a phase in which a current of the same direction as that of the introduced current flows is supplied to the lower electrode 16. Thus, these currents may be summated. Therefore, it was found that, when the angular position θr is 27 degrees, as shown in FIG. 11A, approximately the same value of currents flow through the upper electrode 14 and the lower electrode 16. In addition, when the angular position θr is 27 degrees, as shown in FIG. 11B, the direct current potential of the lower electrode 16 was a negative and large-absolute value. Therefore, it was confirmed that, when the angular position θr is 27 degrees, it is possible to irradiate ions of a relatively high energy to the workpiece disposed above the lower electrode 16.

When the angular position θr is 0 degrees, no high-frequency power is supplied to the lower electrode 16, but a part of the current from the upper electrode 14 is introduced to the lower electrode 16. Therefore, as shown in FIG. 11A, the current value of the lower electrode 16 was not zero. In addition, as shown in FIG. 11B, the direct current potential of the lower electrode 16 was a negative value. Thus, it was confirmed that the energy of ions incident on the workpiece W is not minimized when the angular position θr is 0 degrees.

When the angular position θr was −25 degrees, as shown in FIG. 11A, a current of the same value as that of the current introduced from the upper electrode 14 to the lower electrode 16 was supplied from the second coil to the lower electrode 16, whereby these currents were canceled out. In addition, as shown in FIG. 11B, the direct current potential of the lower electrode 16 was a large positive value. Accordingly, it was confirmed that the energy of ions incident on the workpiece W is significantly reduced when the angular position θr is −25 degrees. As can be seen from the description above, according to the plasma processing apparatus 10 equipped with the transformer 100, it is possible to minutely adjust the energy of ions incident on the workpiece W disposed above the lower electrode 16.

Hereinafter, an embodiment of a plasma processing method using the plasma processing apparatus 10 will be described. FIG. 12 shows a timing chart in relation to a plasma processing method in accordance with the embodiment. This plasma processing method can be implemented using plasma processing apparatuses according to some other embodiments, which will be described later.

As shown in FIG. 12, the plasma processing method includes a step ST1 (a first step) and a step ST2 (a second step). The step ST1 and the step ST2 are repeated alternately. In the step ST1, the angular position θr in the rotational direction of the pair of secondary-side coils 106 is set to be a first angular position. The first angular position is an angular position in which the energy of ions incident on the workpiece is relatively low, and may be, for example, −25 degrees. In the step ST1, a gas A and a gas B are supplied into the chamber 12c. The flow rate of the gas A in the step ST1 is a first flow rate, for example, 50 sccm. The flow rate of the gas B in the step ST1 is a second flow rate, for example, 120 sccm. The gas A is not limited, and may be a rare gas such as an argon gas. The gas B is not limited, and may be, for example, a precursor gas for film formation. The precursor gas may be, for example, a silicon-containing gas. In the step ST1, the pressure in the chamber 12c is set to be a relatively high first pressure, for example, 2 Torr (266.6 Pa). The high-frequency power of the high-frequency power source 18 is set as a first power, for example, 1000 W.

In the step ST1, plasma of the gas A and the gas B is generated, and ions and/or radicals in the plasma are irradiated to the workpiece. In the step ST1, since the angular position θr is set to be the first angular position, the energy of ions irradiated to the workpiece is relatively low. Therefore, in the case where the gas B is a precursor gas, damage to a precursor and a film formed on the workpiece may be suppressed.

In the step ST2, the angular position θr in the rotational direction of the pair of secondary-side coils 106 is set to be a second angular position. The second angular position is an angular position in which the energy of ions incident on the workpiece is relatively high, and may be, for example, 27 degrees. In the step ST2, the gas A is supplied into the chamber 12c. The flow rate of the gas A in step ST2 is, for example, the first flow rate described above. The flow rate of the gas B in the step ST2 is a third flow rate, for example, 0 sccm. In the step ST2, the pressure in the chamber 12c is set to be a relatively low second pressure, for example, 0.8 Torr (106.7 Pa). The high-frequency power of the high-frequency power source 18 is set to be a second power, for example, 1200 W, which is higher than the first power.

In the step ST2, plasma of the gas A is generated, and ions and/or radicals in the plasma are irradiated to the workpiece. In the step ST2, since the angular position θr is set to be the second angular position, the energy of ions to be irradiated to the workpiece is relatively high. Therefore, in the case where the gas B is a precursor gas, it is possible to remove an excessive precursor and/or unnecessary components in the precursor formed on the workpiece in the step ST1. According to the present plasma processing method, it is possible to form a film in an atomic layer level when the gas B is a precursor gas. The plasma processing method may be also used for other plasma processes, for example, an atomic layer-level etching, as well as the film formation of an atomic layer level.

In addition, in the plasma processing method, it is not necessary to stop supply of a high-frequency power from the high-frequency power source 18 to the first coil 104 during a transition between processes. This is due to the use of the transformer 100. Specifically, this is because the first high-frequency power in the second coil 108, the second high-frequency power in the third coil 110, and a phase relationship between the first and second high-frequency powers can be changed by adjusting the angular position θr, without switching the tab, i.e., without using a contact point. Therefore, according to the plasma processing method, throughput of a plasma process alternately repeating the steps ST1 and ST2 is improved. The plasma processing method may further include other steps in the cycle including the steps ST1 and the ST2.

Figure 13:
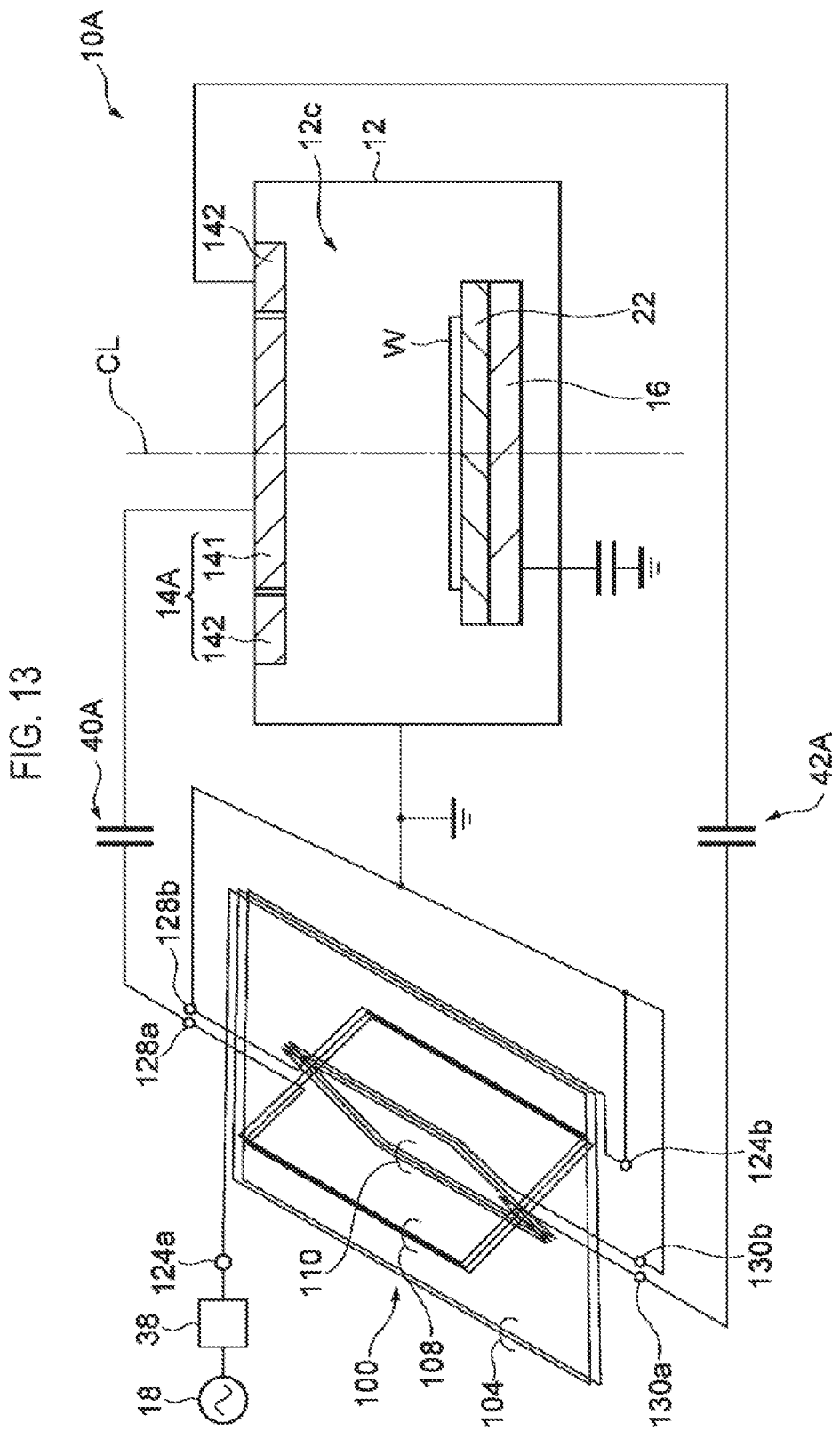
FIG. 13 illustrates a plasma processing apparatus according to a second embodiment.

Next, a plasma processing apparatus according to a second embodiment will be described. FIG. 13 is a view illustrating a plasma processing apparatus according to the second embodiment. Like FIG. 10, FIG. 13 schematically shows the plasma processing apparatus of the second embodiment. Hereinafter, the difference between a plasma processing apparatus 10A of the second embodiment and the plasma processing apparatus 10 will be described, while the same description as the plasma processing apparatus 10 will be omitted.

The plasma processing apparatus 10A includes an upper electrode 14A. The upper electrode 14A includes a first electrode (inner electrode) 141 and a second electrode (outer electrode) 142. The first electrode 141 intersects with the central line CL. The first electrode 141 has a planar circular shape. A central line of the first electrode 141 coincides with the central line CL. Also, the central line CL is a central line of the chamber 12c and extends in the vertical direction. The second electrode 142 is installed in the outer side of the first electrode 141 in the radial direction with respect to the central line CL. The second electrode 142 has a planar annular shape extending around the central line CL.

The terminal 128a of the transformer 100 is connected to the first electrode 141 through a capacitor 40A. Thus, one end of the second coil 108 is connected to the first electrode 141. The terminal 130a of the transformer 100 is connected to the second electrode 142 through a capacitor 42A. Thus, one end of the third coil 110 is connected to the second electrode 142.

Here, a current that flows in the same direction as that of the current flowing from the upper electrode 14A to the lower electrode 16 is defined as an in-phase current. In the plasma processing apparatus 10A, when the angular position θr is set such that an in-phase current is supplied to each of the first electrode 141 and the second electrode 142, it is possible to adjust plasma density distribution in the radial direction with respect to the central line CL. Meanwhile, when the angular position θr is set such that currents in opposite directions are supplied to between the two secondary-side coils and between the two electrodes of the chamber (that is, such that currents in antiphase with each other are supplied to the first electrode 141 and the second electrode 142, respectively), a current flows between the first electrode 141 and the second electrode 142. As a result, a current flowing through the lower electrode 16 is reduced. Accordingly, the energy of ions incident on the workpiece W disposed above the lower electrode 16 is reduced.

The plasma processing method according to the embodiment described above may be also performed in the plasma processing apparatus 10A. In the case of performing the plasma processing method in the plasma processing apparatus 10A, in the step ST1, the angular position θr is set such that currents in antiphase with each other are supplied to the first electrode 141 and the second electrode 142, respectively. In the step ST2, the angular position θr is set such that an in-phase current is supplied to each of the first electrode 141 and the second electrode 142.

Figure 14:
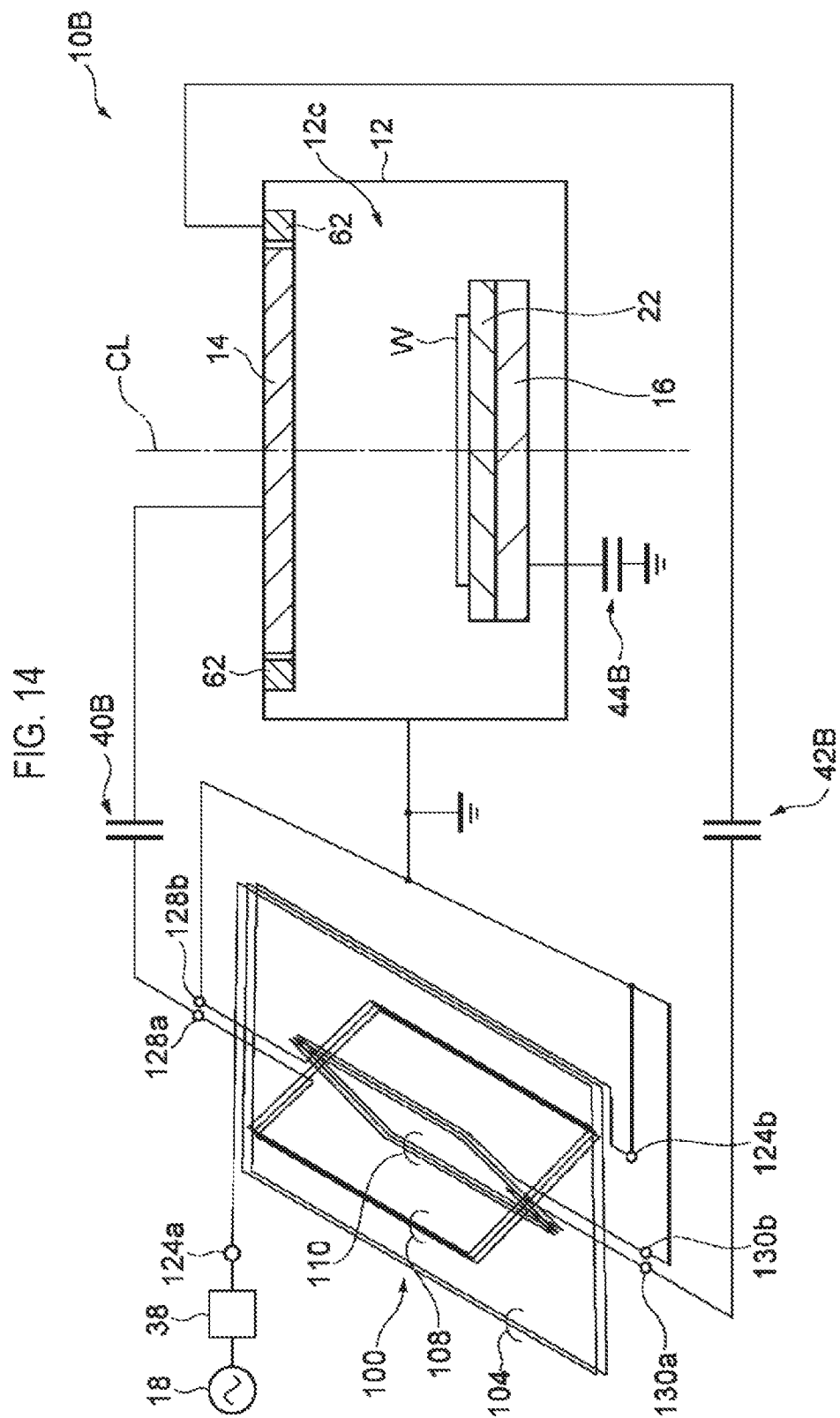
FIG. 14 illustrates a plasma processing apparatus according to a third embodiment.

Next, a plasma processing apparatus according to a third embodiment will be described. FIG. 14 is a view illustrating a plasma processing apparatus according to the third embodiment. Like FIG. 10, FIG. 14 schematically shows a plasma processing apparatus of the third embodiment. Hereinafter, the difference between a plasma processing apparatus 10B of the third embodiment and the plasma processing apparatus 10 will be described, while the same description as the plasma processing apparatus 10 will be omitted.

The plasma processing apparatus 10B further includes an electrode 62. The electrode 62 is a second electrode in the third embodiment. The electrode 62 is installed to be closer to the side wall of the chamber main body 12 than the upper electrode 14. In the embodiment, the electrode 62 is installed between the upper electrode 14 and the side wall of the chamber main body 12, and has, for example, a planar annular shape. The vertical position of the electrode 62 may be an arbitrary position as long as the electrode 62 is positioned above the stage 20 and substantially at the same level as or below the position of the upper electrode 14.

The terminal 130a of the transformer 100 is connected to the electrode 62 through a capacitor 42B. Therefore, one end of the third coil 110 is connected to the electrode 62. In the plasma processing apparatus 10B, the lower electrode 16 is connected to one end of a capacitor 44B and the other end of the capacitor 44B is grounded.

Here, a current that flows in the same direction as that of the current flowing from the upper electrode 14 to the lower electrode 16 is defined as an in-phase current. In the plasma processing apparatus 10B, when the angular position θr is set such that an in-phase current is supplied to each of the upper electrode 14 and the electrode 62, a current is introduced to the lower electrode 16 and the chamber main body 12, thereby lowering the potential of the lower electrode 16. Accordingly, ions of a relatively high energy are irradiated to the workpiece disposed above the lower electrode 16. Meanwhile, when the angular position θr is set such that currents in opposite directions are supplied to between the two secondary-side coils and the two electrodes of the chamber (that is, such that currents in antiphase with each other are supplied to the upper electrode 14 and the electrode 62, respectively), a current flows between the upper electrode 14 and the electrode 62. As a result, the current flowing through the lower electrode 16 is reduced. Accordingly, the energy of ions incident on the workpiece W disposed above the lower electrode 16 is reduced. As described above, according to the plasma processing apparatus 10B, it is possible to adjust the energy of ions irradiated to the workpiece W disposed above the lower electrode 16 without directly supplying a current to the lower electrode 16.

The plasma processing method of the embodiment described above may also be performed in the present plasma processing apparatus 10B. In the case of performing the plasma processing method in the plasma processing apparatus 10B, in the step ST1, the angular position θr is set such that currents in antiphase with each other are supplied to the upper electrode 14 and the electrode 62, respectively. In the step ST2, the angular position θr is set such that an in-phase current is supplied to each of the upper electrode 14 and the electrode 62.

Figure 15:
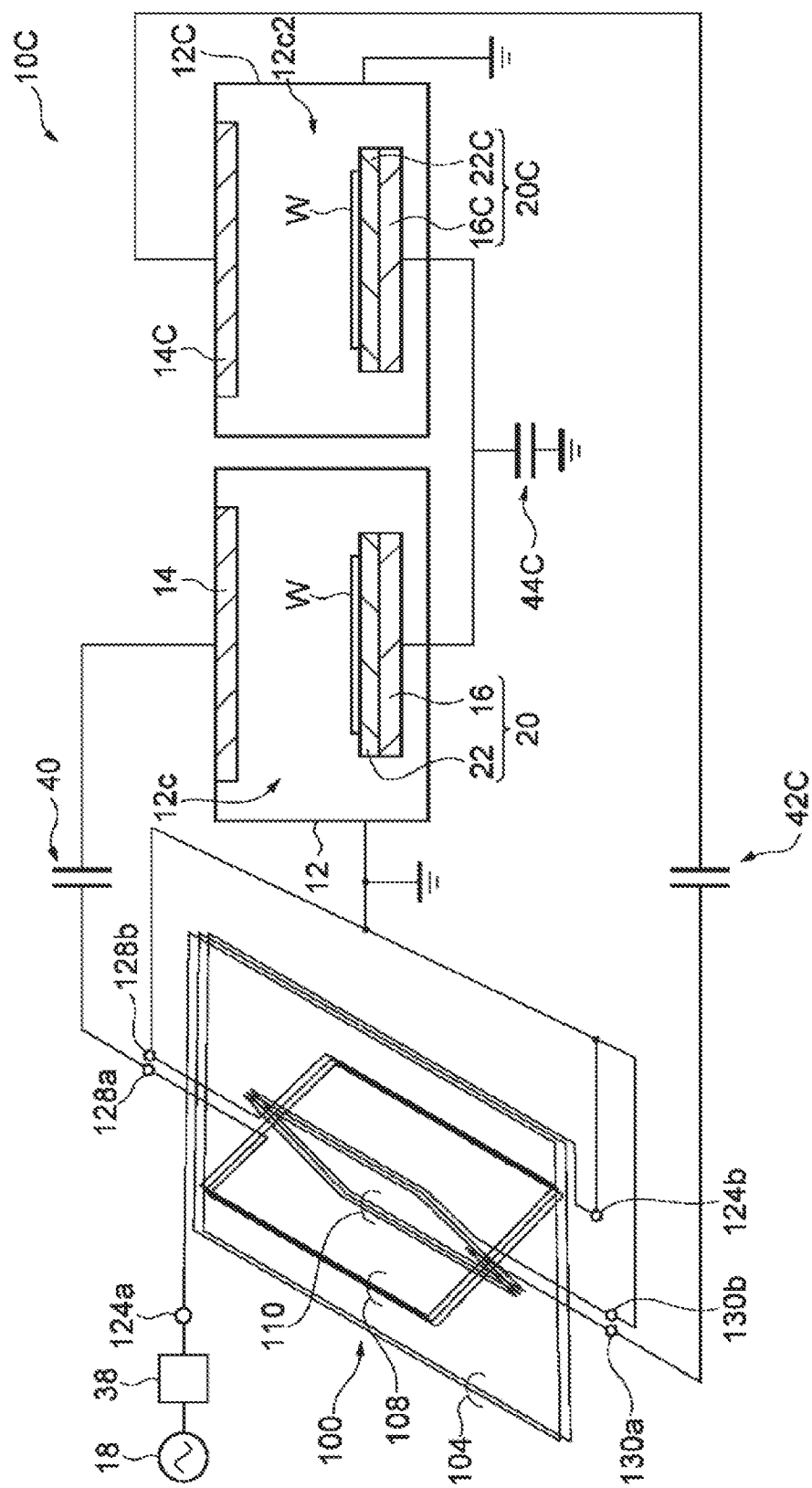
FIG. 15 illustrates a plasma processing apparatus according to a fourth embodiment.

Next, a plasma processing apparatus according to a fourth embodiment will be described. FIG. 15 is a view illustrating a plasma processing apparatus according to the fourth embodiment. Like FIG. 10, FIG. 15 schematically shows a plasma processing apparatus of the fourth embodiment. Hereinafter, the difference between a plasma processing apparatus 10C of the fourth embodiment and the plasma processing apparatus 10 will be described, while the same description as the plasma processing apparatus 10 will be omitted.

The plasma processing apparatus 10C further includes a chamber main body 12C that provides a chamber 12c2, an upper electrode 14C, and a stage 20C including a lower electrode 16C and an electrostatic chuck 22C. That is to say, the plasma processing apparatus 10C includes a first chamber main body (a first processing compartment) providing a first chamber (a first processing space) and a second chamber main body (a second processing compartment) providing a second chamber (a second processing space). The plasma processing apparatus 10C includes: a first upper electrode and a first lower electrode installed to have a space in the first chamber interposed therebetween; and a second upper electrode and a second lower electrode installed to have a space in the second chamber interposed therebetween.

The chamber main body 12C has the same configuration as the chamber main body 12, and is grounded. The upper electrode 14C has the same configuration as the upper electrode 14, and closes the opening of the upper end portion of the chamber main body 12C. The stage 20C has the same configuration as the stage 20, and is installed in the chamber defined by the chamber main body 12C. The lower electrode 16C and the electrostatic chuck 22C are configured to be the same as the lower electrode 16 and the electrostatic chuck 22, respectively. The plasma processing apparatus 10C further includes a gate valve to open and close the opening of the chamber main body 12C, a gas supply part for supplying a gas into the chamber main body 12C, and an exhaust device for depressurizing the chamber in the chamber main body 12C. The first processing space and the second processing space may be provided by the chamber main body 12 and the chamber main body 12C, respectively, which are separated from each other. Alternatively, the first processing space and the second processing space may be provided as two processing spaces dividedly formed in a single chamber main body by a simple partition or the like. In this case, a common exhaust device as a single system may be used for depressurizing the first processing space and the second processing space.

The terminal 130a of the transformer 100 is connected to the upper electrode 14C through a capacitor 42C. Therefore, one end of the third coil 110 is connected to the upper electrode 14C. In the plasma processing apparatus 10C, the lower electrode 16 and the lower electrode 16C are connected to one end of a capacitor 44C and the other end of the capacitor 44C is grounded.

The plasma processing apparatus 10C can distribute two high-frequency powers, which are generated based on the high-frequency power from the high-frequency power source 18, to the two electrodes 14 and 14C for a double-chamber system.

Figure 16:
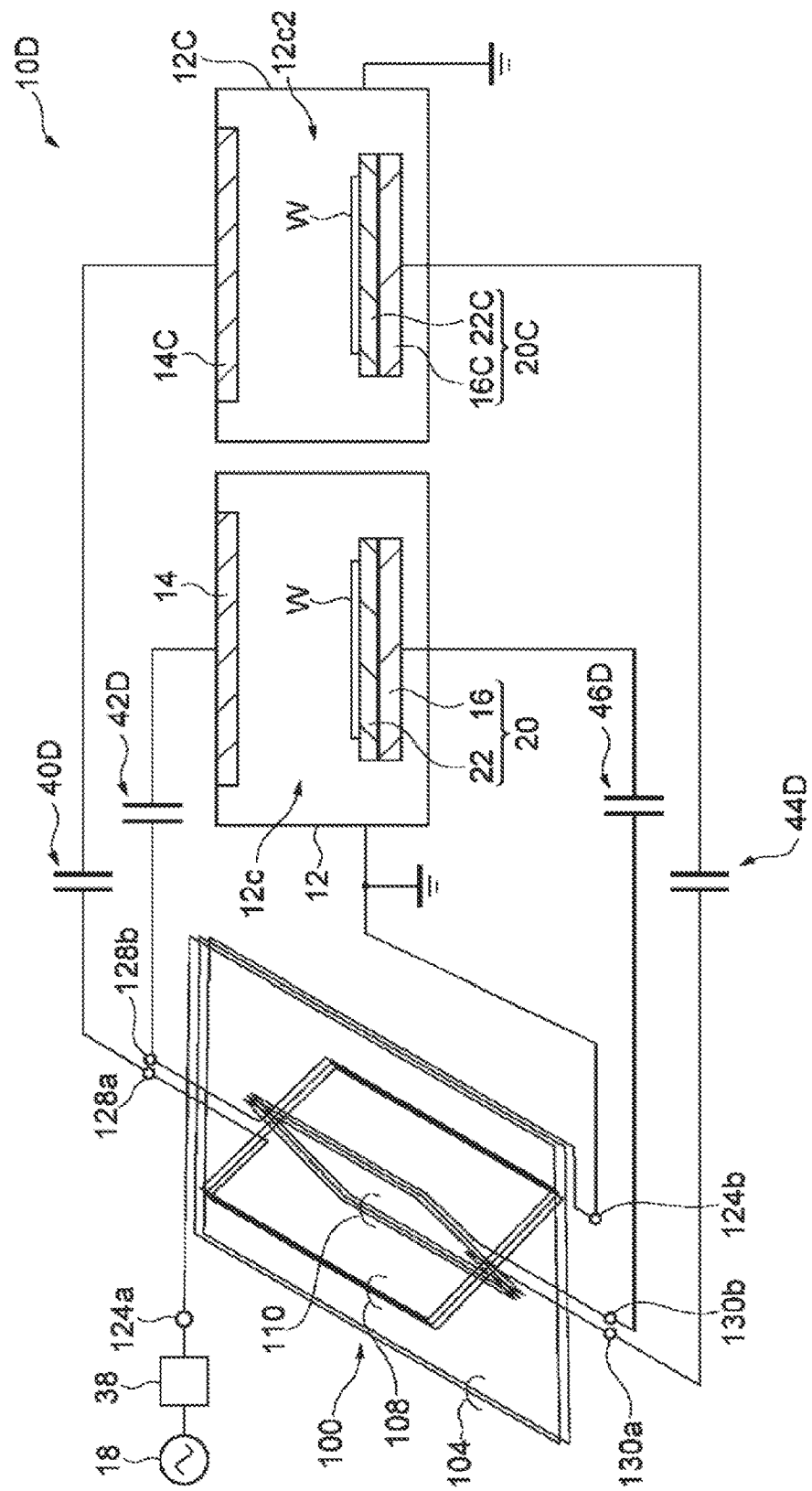
FIG. 16 illustrates a plasma processing apparatus according to a fifth embodiment.

Next, a plasma processing apparatus according to a fifth embodiment will be described. FIG. 16 is a view illustrating a plasma processing apparatus according to the fifth embodiment. Like FIG. 15, FIG. 16 schematically shows a plasma processing apparatus of the fifth embodiment. Hereinafter, the difference between a plasma processing apparatus 10D of the fifth embodiment and the plasma processing apparatus 10C will be described, while the same description as the plasma processing apparatus 10C will be omitted.

In the plasma processing apparatus 10D, the terminal 128a is connected to the upper electrode 14C through a capacitor 40D. The terminal 128b is connected to the upper electrode 14 through a capacitor 42D. The terminal 130a is connected to the lower electrode 16C through a capacitor 44D. The terminal 130b is connected to the lower electrode 16 through a capacitor 46D. Therefore, one end of the second coil 108, the other end of the second coil 108, one end of the third coil 110, and the other end of the third coil 110 are connected to the upper electrode 14C, the upper electrode 14, the lower electrode 16C, and the lower electrode 16, respectively.

The same current flows through both ends of the second coil 108, and the same current flows through both ends of the third coil 110. Thus, in the plasma processing apparatus 10D, currents of the same value are supplied to the upper electrode 14 and the upper electrode 14C. In addition, currents of the same value are supplied to the lower electrode 16 and the lower electrode 16C. Therefore, it is possible to supply high-frequency powers of substantially the same conditions to the upper electrodes of the two chambers and to the lower electrodes of the two chambers, respectively. That is to say, the machine difference between the two chambers may be suppressed. In addition, it is possible to control magnitudes of two high-frequency powers supplied to the upper electrode 14 and the lower electrode 16, respectively, and a phase difference between the two high-frequency powers. Also, it is possible to control magnitudes of two high-frequency powers supplied to the upper electrode 14C and the lower electrode 16C, respectively, and a phase between the two high-frequency powers. Therefore, it is possible to adjust the energy of ions irradiated to the workpiece W disposed above the lower electrode 16 and the energy of ions irradiated to the workpiece W disposed above the lower electrode 16C.

Figure 17:
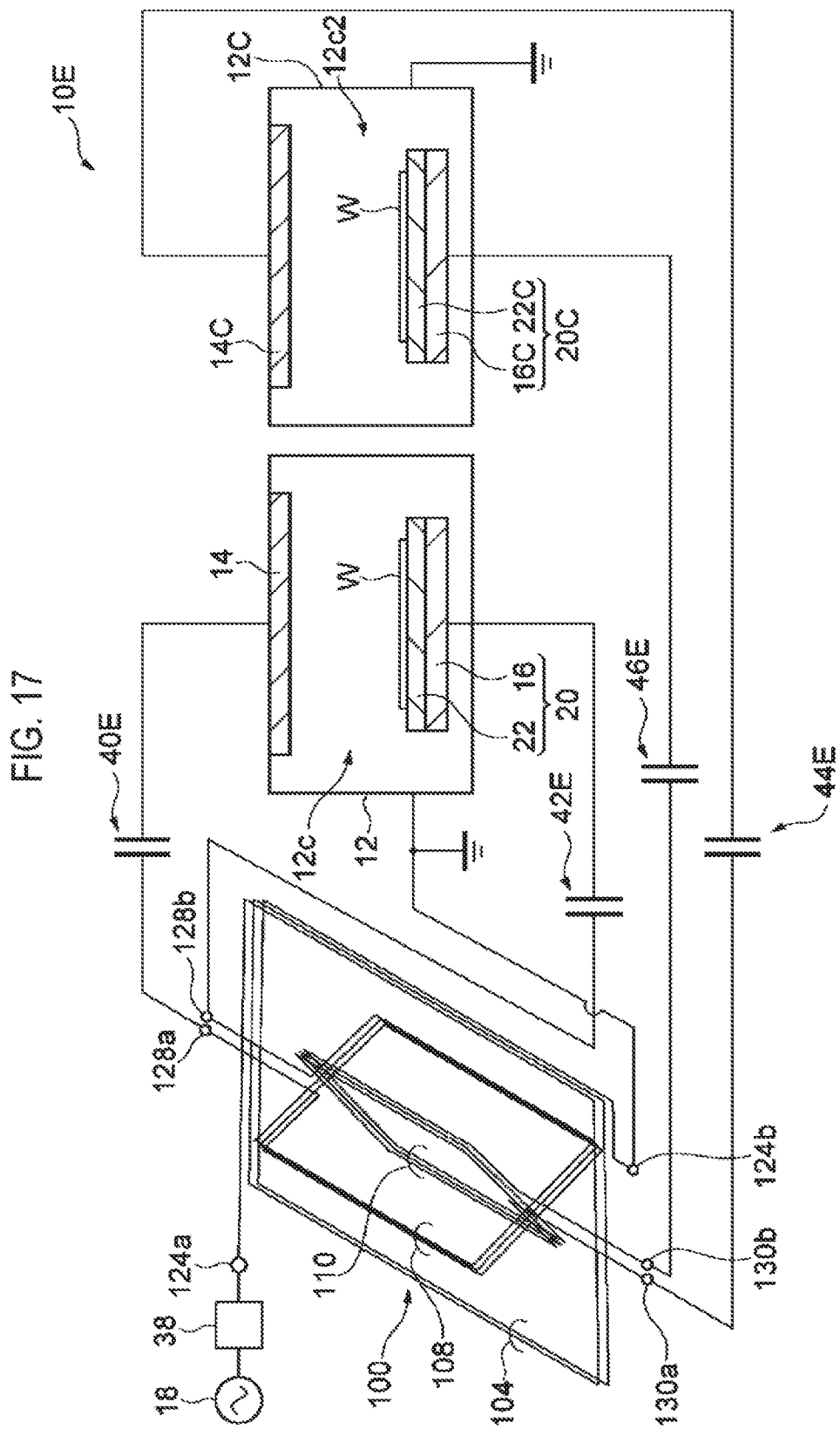
FIG. 17 illustrates a plasma processing apparatus according to a sixth embodiment.

Next, a plasma processing apparatus according to a sixth embodiment will be described. FIG. 17 is a view illustrating a plasma processing apparatus according to the sixth embodiment. Like FIG. 15, FIG. 17 schematically shows a plasma processing apparatus of the sixth embodiment. Hereinafter, the difference between a plasma processing apparatus 10E of the sixth embodiment and the plasma processing apparatus 10C will be described, while the same description as the plasma processing apparatus 10C will be omitted.

In the plasma processing apparatus 10E, the terminal 128a is connected to the upper electrode 14 through a capacitor 40E. The terminal 128b is connected to the lower electrode 16 through a capacitor 42E. The terminal 130a is connected to the upper electrode 14C through a capacitor 44E. The terminal 130b is connected to the lower electrode 16C through a capacitor 46E. Therefore, one end of the second coil 108, the other end of the second coil 108, one end of the third coil 110, and the other end of the third coil 110 are connected to the upper electrode 14, the lower electrode 16, the upper electrode 14C, and the lower electrode 16C, respectively.

Since the same current flows through both ends of the second coil 108, currents of the same value flow through the upper electrode 14 and the lower electrode 16, respectively. If a current that flows in the same direction as that of the current flowing from the upper electrode 14 to the lower electrode 16 is defined as an in-phase current, an in-phase current flows through each if the upper electrode 14 and the lower electrode 16. In addition, since the same current flows through both ends of the third coil 110, currents of the same value flow through the upper electrode 14C and the lower electrode 16C, respectively. If a current that flows in the same direction as that of the current flowing from the upper electrode 14C to the lower electrode 16C is defined as an in-phase current, an in-phase current flows through each of the upper electrode 14C and the lower electrode 16C. Therefore, a current flowing through the chamber main body 12 and a current flowing through the chamber main body 12C are suppressed. Thus, plasma is trapped between the upper electrode 14 and the lower electrode 16 in the chamber main body 12, and plasma is trapped between the upper electrode 14C and the lower electrode 16C in the chamber main body 12C. As a result, it is possible to generate stable plasma in each of the two chambers.

In the plasma processing apparatus 10E, it is possible to adjust the ratio of the first high-frequency power supplied to the upper electrode 14 and the lower electrode 16 to the second high-frequency power supplied to the upper electrode 14C and the lower electrode 16C by adjusting the angular position θr of the pair of secondary-side coils 106. For example, it is possible to set the first high-frequency power and the second high-frequency power to be the same. Alternatively, it is also possible to set only one of the first high-frequency power and the second high-frequency power to be zero.

Figure 18:
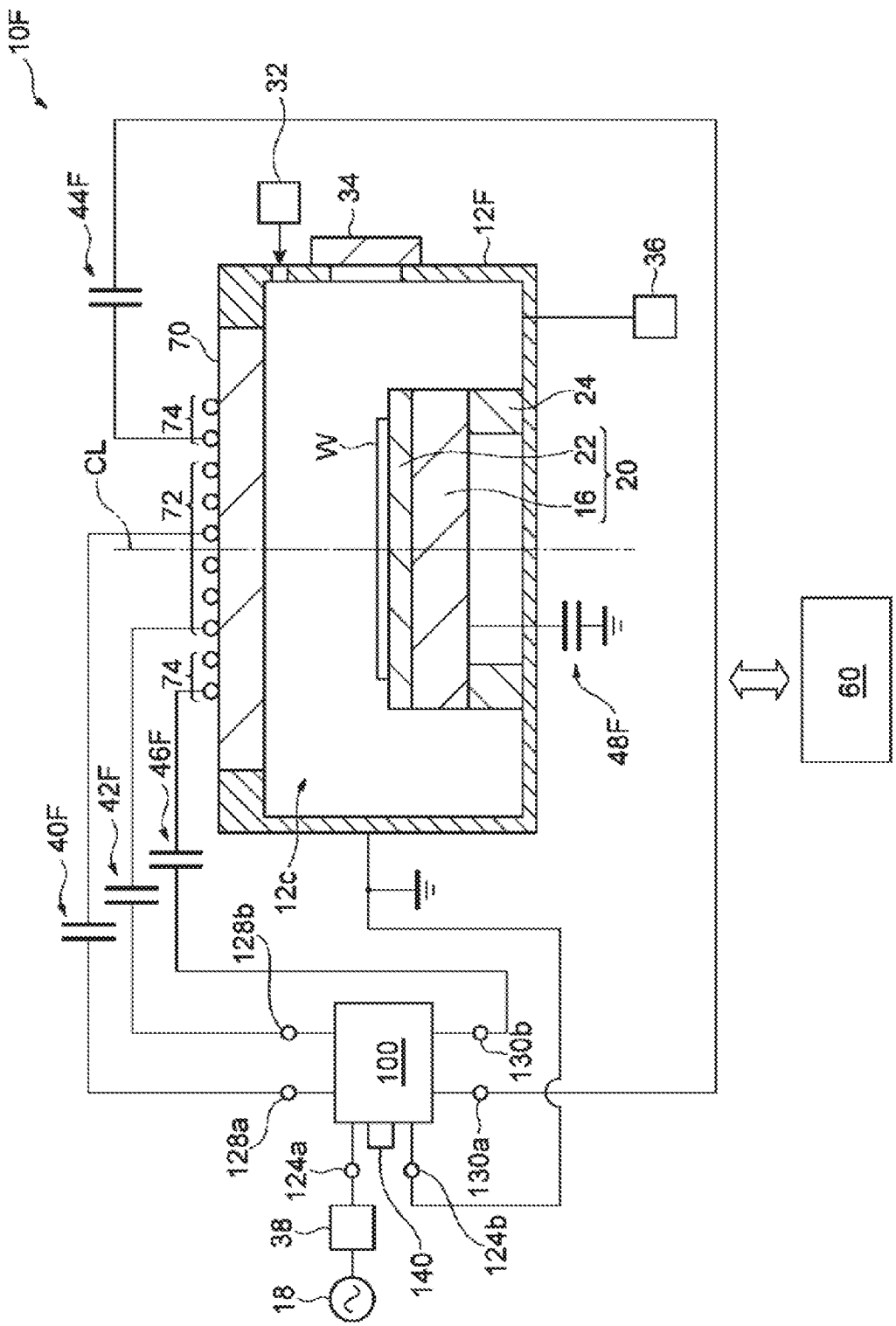
FIG. 18 illustrates a plasma processing apparatus according to a seventh embodiment.

Next, a plasma processing apparatus according to a seventh embodiment will be described. FIG. 18 is a view illustrating a plasma processing apparatus according to the seventh embodiment. Like FIG. 9, FIG. 18 schematically shows a plasma processing apparatus of the seventh embodiment with its chamber main body cut away. Hereinafter, the difference between a plasma processing apparatus 10F of the seventh embodiment and the plasma processing apparatus 10 will be described, while the same description as the plasma processing apparatus 10 will be omitted.

The plasma processing apparatus 10F is an inductively coupled plasma processing apparatus. The plasma processing apparatus 10F includes a chamber main body 12F. The chamber main body 12F has the same configuration as the chamber main body 12. The opening of the upper end portion of the chamber main body 12F is closed by a window member 70. The window member 70 is formed of a dielectric material such as quartz. A first antenna coil 72 and a second antenna coil 74 are installed on the window member 70. The first antenna coil 72 extends around the central line CL of the chamber 12c provided by the chamber main body 12F. The second antenna coil 74 also extends around the central line CL, and is installed in the outer side of the first antenna coil 72.

The terminal 128a of the transformer 100 is connected to one end of the first antenna coil 72 through a capacitor 40F, and the terminal 128b is connected to the other end of the first antenna coil 72 through a capacitor 42F. The terminal 130a is connected to one end of the second antenna coil 74 through a capacitor 44F, and the terminal 130b is connected to the other end of the second antenna coil 74 through a capacitor 46F. The lower electrode 16 is connected to one end of a capacitor 48F and the other end of the capacitor 48F is grounded.

In the plasma processing apparatus 10F, it is possible to adjust the ratio of the first high-frequency power supplied from the second coil 108 to the first antenna coil 72 to the second high-frequency power supplied from the third coil 110 to the second antenna coil 74. A variable magnetic field generated by the first antenna coil 72 mainly contributes to adjustment of plasma density in a region including the central line CL. A variable magnetic field generated by the second antenna coil 74 mainly contributes to adjustment of plasma density in a region spaced apart from the central line CL. Therefore, according to the plasma processing apparatus 10F, it is possible to adjust plasma density distribution in the radial direction of the chamber 12c.

Figure 19:
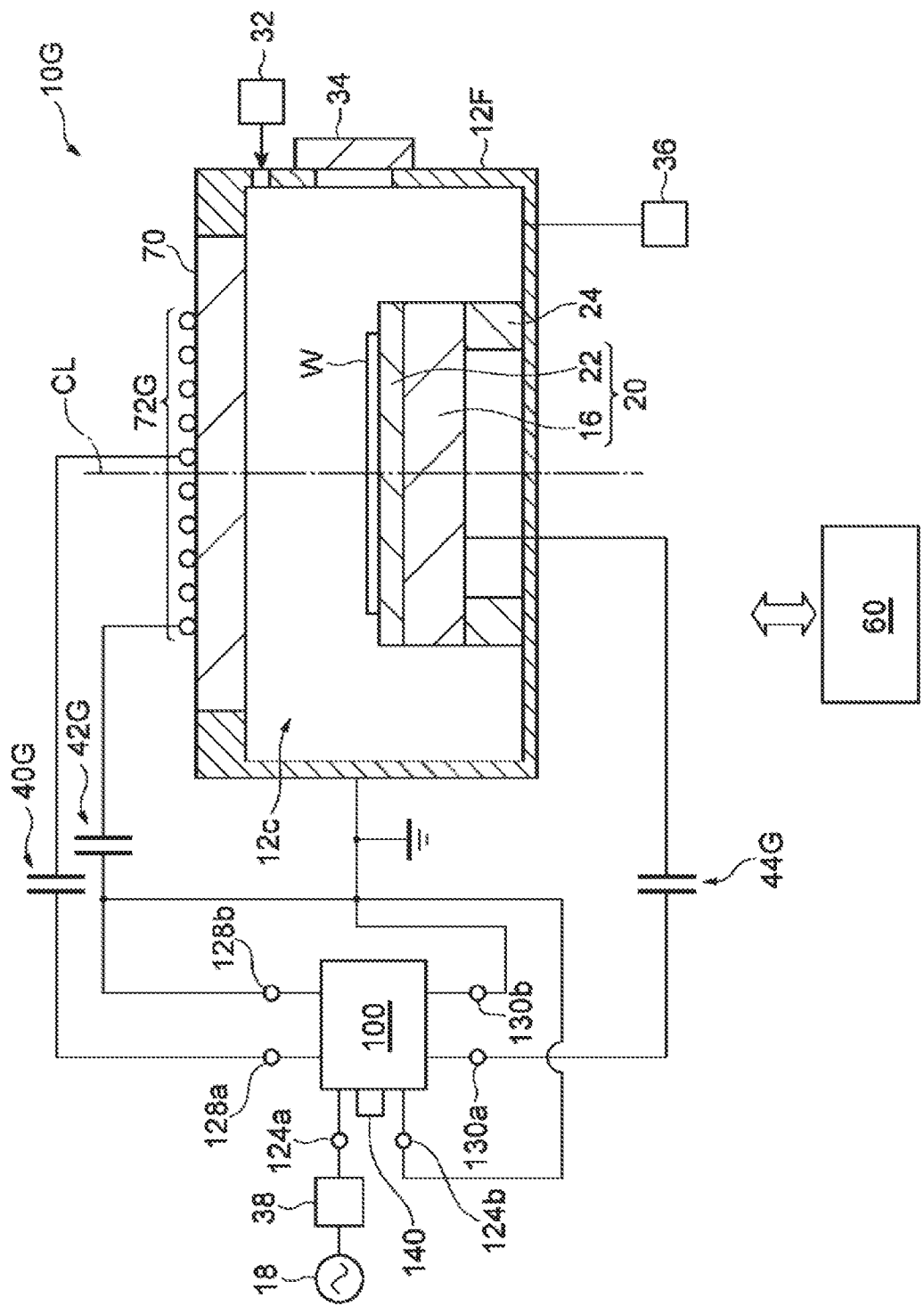
FIG. 19 illustrates a plasma processing apparatus according to an eighth embodiment.

Next, a plasma processing apparatus according to an eighth embodiment will be described. FIG. 19 is a view illustrating a plasma processing apparatus according to the eighth embodiment. Like FIG. 18, FIG. 19 schematically shows a plasma processing apparatus according to the eighth embodiment with its chamber main body cut away. Hereinafter, the difference between a plasma processing apparatus 10G of the eighth embodiment and the plasma processing apparatus 10F will be described, while the same description as the plasma processing apparatus 10F will be omitted.

In the plasma processing apparatus 10G, an antenna coil 72G is installed on the window member 70. The antenna coil 72G extends around the central line CL. The terminal 128a of the transformer 100 is connected to one end of the antenna coil 72G through a capacitor 40G, and the terminal 128b is connected to the other end of the antenna coil 72G through a capacitor 42G. The terminal 130a is connected to the lower electrode 16 through a capacitor 44G. The terminals 128b and 130b are grounded.

In the plasma processing apparatus 10G, one of two high-frequency powers generated based on the high-frequency power from the high-frequency power source 18 is supplied to the antenna coil 72G, and the other one of the two high-frequency powers is supplied to the lower electrode 16. In other words, one of the two high-frequency powers is used for plasma generation, and the other one of the two high-frequency powers is used for controlling the ion energy.

Figure 20:
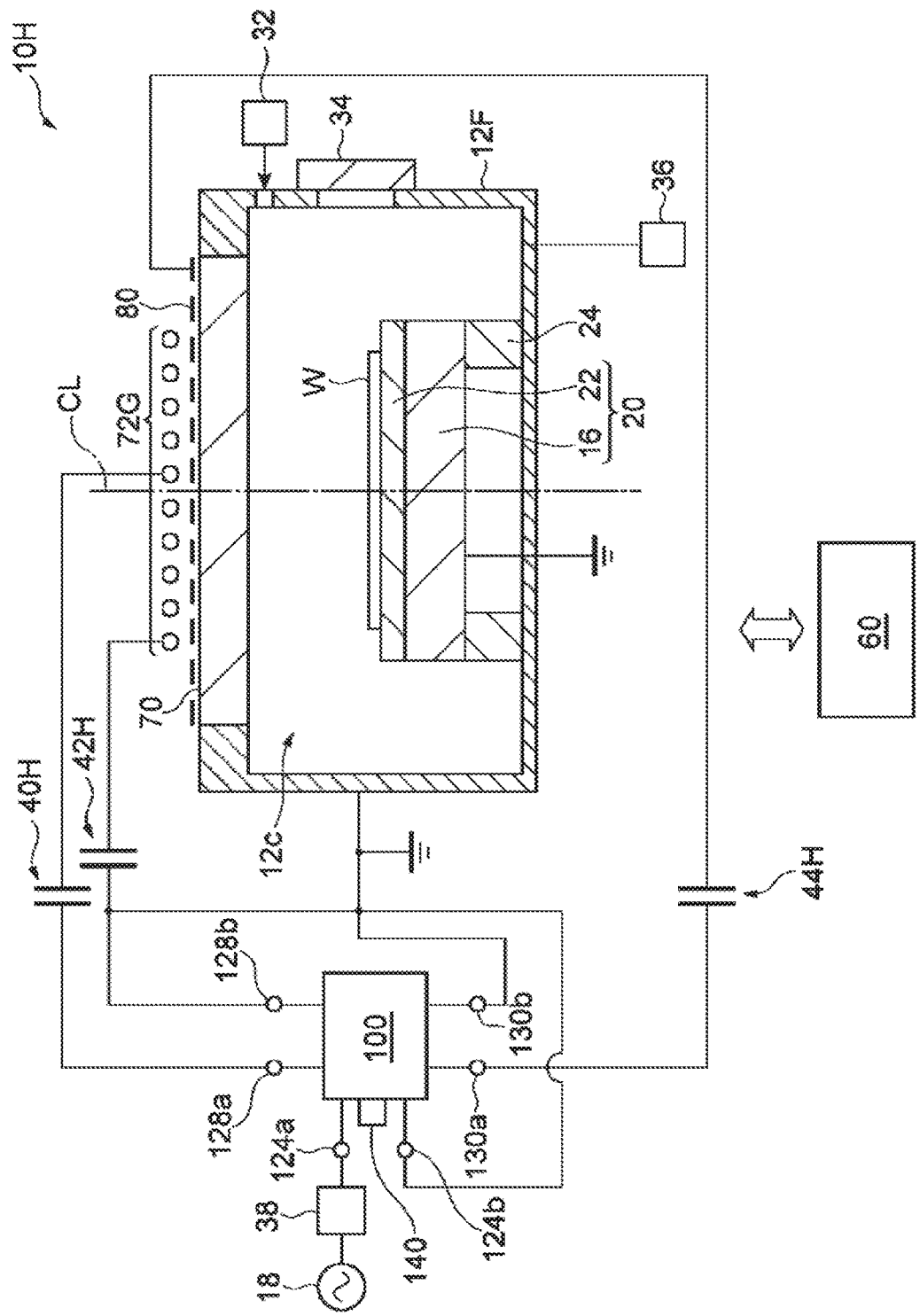
FIG. 20 illustrates a plasma processing apparatus according to another embodiment.
Figure 21:
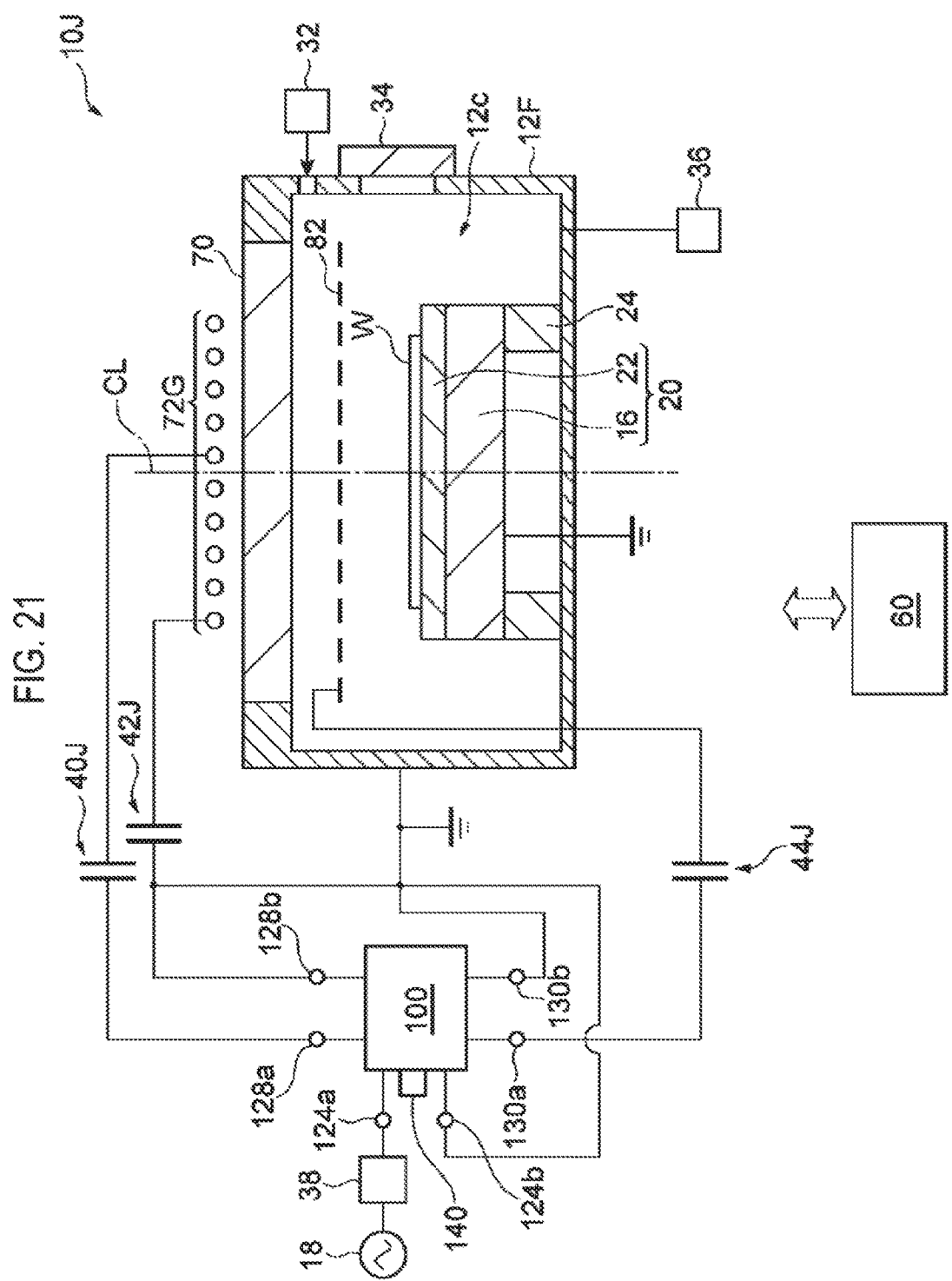
FIG. 21 illustrates a plasma processing apparatus according to still another embodiment.

Alternatively, as shown in FIG. 20, the terminal 130a may be connected to a Faraday shield 80 through a capacitor 44H without being connected to the lower electrode 16. In a plasma processing apparatus 10H shown in FIG. 20, the Faraday shield 80 is installed between the antenna coil 72G and the window member 70. Alternatively, as shown in FIG. 21, the terminal 130a may be connected to a separate electrode 82 through a capacitor 44J without being connected to the lower electrode 16. In a plasma processing apparatus 10J shown in FIG. 21, the electrode 82 is installed in the chamber 12c. In the plasma processing apparatuses 10H and 10J, it is also possible to control the energy of ions irradiated to the workpiece W.

Figure 22:
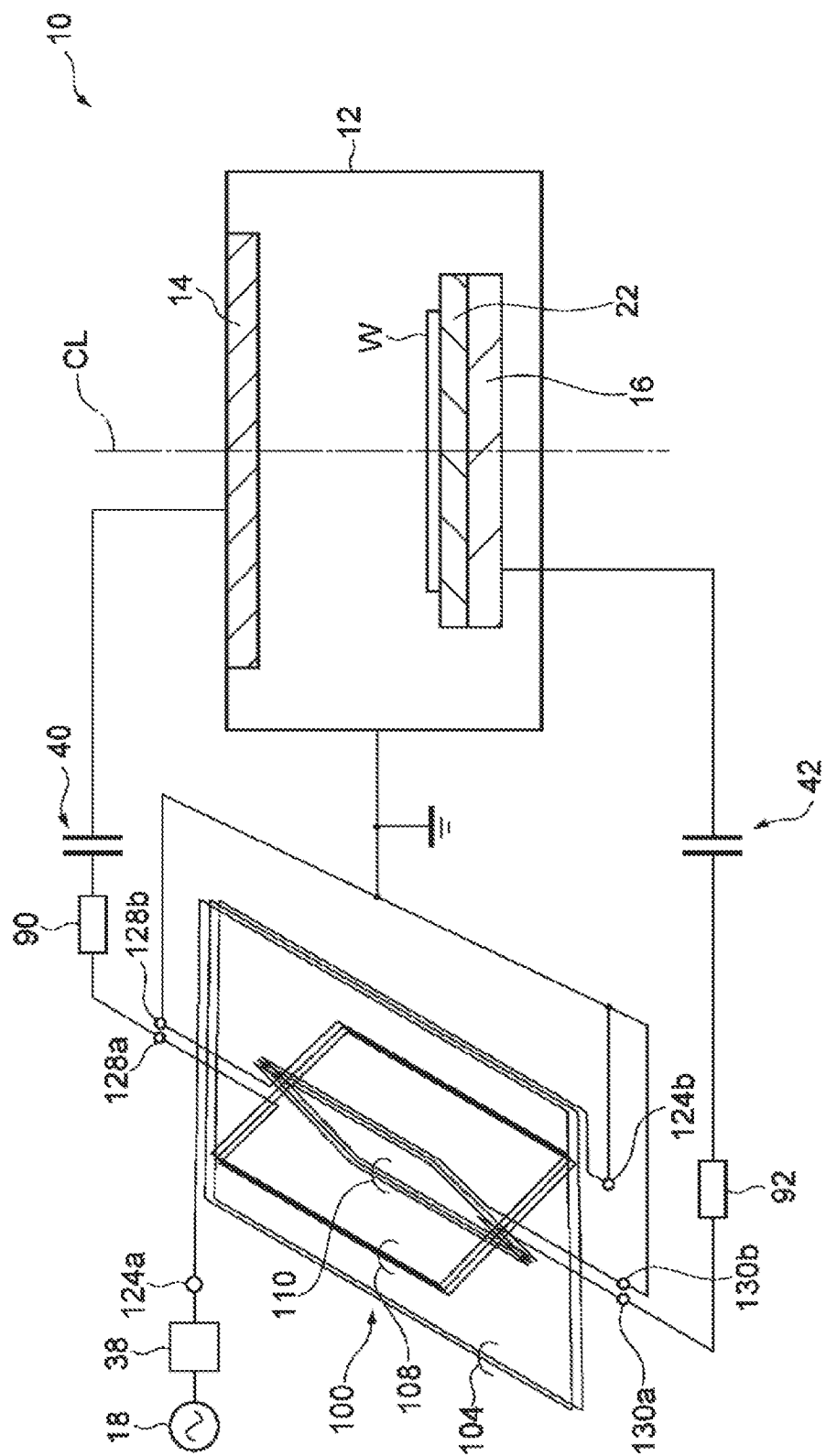
FIG. 22 illustrates a plasma processing apparatus according to a modification of the first embodiment.

Next, description will be made with reference to FIG. 22. FIG. 22 is a view showing a plasma processing apparatus according to a modification of the first embodiment. In the plasma processing apparatus 10 shown in FIG. 22, a sensor 90 is connected to the terminal 128a, i.e., one end of the second coil 108, and a sensor 92 is connected to the terminal 130a. i.e., one end of the third coil 110. The sensors 90 and 92 may be current sensors.

As described above, the energy of ions irradiated to the workpiece W depends on the current of the upper electrode 14 and the current of the lower electrode 16. By using the plasma processing apparatus 10 shown in FIG. 22, it is possible to measure a current value of the upper electrode 14 and a current value of the lower electrode 16 while changing the angular position θr of the pair of secondary-side coils in the transformer 100. Thus, it can be derived that the ion energy becomes the minimum in an angular position minimizing the current value flowing through the lower electrode 16 and the ion energy becomes the maximum in an angular position maximizing the current value flowing through the lower electrode 16. Further, it is possible to derive an angular position θr suitable for a process by performing the same process as an actual process in each of a plurality of angular positions θr between the angular position minimizing the ion energy and the angular position maximizing the ion energy. The derived angular position θr suitable for the process may be stored as a part of a recipe for the corresponding process in the storage device of the control part 60.

Also, in the plasma processing apparatuses 10A and 10B, the sensor 90 may be connected to one end of the second coil 108 and the sensor 92 may be connected to one end of the third coil 110. Further, as described above, an angular position θr suitable for a process may be derived and stored as a part of a recipe for the process in the storage device of the control part 60.

Also, in the plasma processing apparatus 10C, the sensor 90 may be connected to one end of the second coil 108 and the sensor 92 may be connected to one end of the third coil 110. Further, in each of the plasma processing apparatuses 10, 10A, 10B and 10C, the angular position θr may be controlled based on a current value measured by the sensor 90 and a current value measured by the sensor 92. More specifically, a first target current value and a second target current value may be pre-stored in the storage device of the control part 60. Then, the control part 60 may control the driving mechanism 140 to adjust the angular position θr so that the difference between the current value measured by the sensor 90 and the first target current value and the difference between the current value measured by the sensor 92 and the second target current value can be reduced.

At least one of the sensors 90 and 92 may be used. The sensors 90 and 92 may be voltage sensors. In each of the plasma processing apparatuses 10D and 10E, a sensor (a current sensor or a voltage sensor) may be connected to at least one of both ends of the second coil 108 and a sensor (a current sensor or a voltage sensor) may be connected to at least one of both ends of the third coil 110. Further, as described above, an angular position θr suitable for a process may be derived and stored as a part of a recipe for the process in the storage device of the control part 60. In addition, as described above, the control part 60 may control the driving mechanism 140 to adjust the angular position θr so that the difference between the current value measured by the sensor and the target current value can be reduced.

As described above, it is possible to minutely control the ratio of the first high-frequency power to the second high-frequency power, which is output from the secondary-side of the transformer. Further, even in the state in which a high-frequency power is supplied to the primary-side coil, it is possible to change the power ratio of two output high-frequency powers. Furthermore, it is possible to switch the phase difference between the first high frequency power and the second high frequency power from in-phase to antiphase or vice versa.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A transformer for a plasma processing apparatus comprising:
    a cylindrical rotary shaft configured to rotate about a central axis of the rotary shaft as a rotational axis;
    a pair of plate-shaped first support members facing each other and being connected with each other by support columns interposed between the pair of first support members, the pair of first support members intersecting with the central axis, and the rotary shaft being rotatably supported by the pair of first support members;
    a pair of disk-shaped second support members facing each other and being installed between the pair of first support members, the pair of second support members intersecting with the central axis and being fixed to the rotary shaft;
    a pair of disk-shaped third support members facing each other and being installed between the pair of second support members, the pair of third support members intersecting with the central axis and being fixed to the rotary shaft;
    a primary-side first coil wound around a first axis so as to alternately pass through an outer side of one of the pair of first support members and an outer side of the other of the pair of first support members, the first axis being perpendicular to the central axis and intersecting with the central axis at a point in a middle of the pair of first support members;
    a secondary-side second coil wound around a second axis so as to alternately pass through an outer side of one of the pair of second support members and an outer side of the other of the pair of second support members, the second axis being perpendicular to the central axis and intersecting with the central axis at a point in an area surrounded by the primary-side first coil; and
    a secondary-side third coil wound around a third axis so as to alternately pass through an outer side of one of the pair of third support members and an outer side of the other of the pair of third support members, the third axis being perpendicular to the rotational central axis and intersecting with the central axis at a point in an area surrounded by the primary-side first coil,
    wherein the secondary-side second coil and the secondary-side third coil are configured to rotate about the central axis by rotation of the rotary shaft, and the second axis and the third axis form a predetermined angle between the second axis and the third axis.

2. The transformer of claim 1, wherein the first coil has a self-inductance greater than a self-inductance of each of the secondary-side second coil and the secondary-side third coil.

3. The transformer of claim 1, wherein the secondary-side third coil has a self-inductance smaller than a self-inductance of the secondary-side second coil.

4. The transformer of claim 1, wherein the predetermined angle is 90 degrees.

5. The transformer of claim 1, wherein the secondary-side second coil and the secondary-side third coil are arranged to secure an insulation distance between the secondary-side second coil and the secondary-side third coil.

6. The transformer of claim 1, wherein one end of the first coil, one end of the secondary-side second coil, and one end of the secondary-side third coil are electrically connected with one another.

7. A capacitively coupled plasma processing apparatus comprising:
    a chamber main body configured to provide a chamber;
    a first electrode as an upper electrode;
    a second electrode as a lower electrode;
    a high-frequency power source; and
    the transformer of claim 1,
    wherein the high-frequency power source is electrically connected to the first coil,
    the first electrode is electrically connected to one end of the secondary-side second coil, and
    the second electrode is electrically connected to one end of the secondary-side third coil.

8. A capacitively coupled plasma processing apparatus comprising:
    a chamber main body configured to provide a chamber;
    an upper electrode;
    a lower electrode;
    a high-frequency power source; and
    the transformer of claim 1,
    wherein the upper electrode includes a first electrode intersecting with a central line of the chamber, the central line extending in a vertical direction, and a second electrode installed in an outer side of the first electrode in a radial direction with respect to the central line,
    the high-frequency power source is electrically connected to the first coil,
    the first electrode is electrically connected to one end of the secondary-side second coil, and
    the second electrode is electrically connected to one end of the secondary-side third coil.

9. A capacitively coupled plasma processing apparatus comprising:
a chamber main body configured to provide a chamber;
a first electrode as an upper electrode;
a lower electrode;
a second electrode installed to be closer to a side wall of the chamber main body than the upper electrode;
a high-frequency power source; and
the transformer of claim 1,
wherein the high-frequency power source is electrically connected to the first coil,
the first electrode is electrically connected to one end of the secondary-side second coil, and
the second electrode is electrically connected to one end of the secondary-side third coil.

10. The plasma processing apparatus of claim 7, wherein an angular position of a pair of secondary-side coils, which includes the secondary-side second coil and the secondary-side third coil, in a rotational direction is set such that a high-frequency current in antiphase with respect to a high-frequency current introduced from the first electrode to the second electrode through plasma is supplied to the second electrode.

11. A capacitively coupled plasma processing apparatus comprising:
a first processing compartment configured to provide a first processing space;
a second processing compartment configured to provide a second processing space;
a first upper electrode and a first lower electrode installed such that a space in the first processing space is interposed therebetween;
a second upper electrode and a second lower electrode installed such that a space in the second processing space is interposed therebetween;
a high-frequency power source;
and the transformer of claim 1, wherein the high-frequency power source is electrically connected to the primary-side first coil,
one of the first upper electrode or the first lower electrode, is electrically connected to one end of the secondary-side second coil, and
one of the second upper electrode or the second lower electrode, is electrically connected to one end of the secondary-side third coil.

12. The plasma processing apparatus of claim 7, further comprising two capacitors connected between the first electrode and the one end of the secondary-side second coil and between the second electrode and the one end of the secondary-side third coil, respectively.

13. The plasma processing apparatus of claim 7, further comprising a sensor connected to one of the one end of the secondary-side second coil and the one end of the secondary-side third coil, wherein the sensor is a current sensor or a voltage sensor.

14. The plasma processing apparatus of claim 13, further comprising another sensor connected to the other one of the one end of the secondary-side second coil and the one end of the secondary-side third coil, wherein the another sensor is a current sensor or a voltage sensor.

15. A capacitively coupled plasma processing apparatus comprising:
a first processing compartment configured to provide a first processing space; a second processing compartment configured to provide a second processing space;
a first upper electrode and a first lower electrode installed such that a space in the first processing space is interposed therebetween;
a second upper electrode and a second lower electrode installed such that a space in the second processing space is interposed therebetween;
a high-frequency power source;
and the transformer of claim 1,
wherein the high-frequency power source is electrically connected to the primary-side first coil,
the first upper electrode is electrically connected to one end of the secondary-side second coil,
the second upper electrode is electrically connected to the other end of the secondary-side second coil,
the first lower electrode is electrically connected to one end of the secondary-side third coil, and
the second lower electrode is electrically connected to the other end of the secondary-side third coil.

16. A capacitively coupled plasma processing apparatus comprising:
a first processing compartment configured to provide a first processing space;
a second processing compartment configured to provide a second processing space;
a first upper electrode and a first lower electrode installed such that a space in the first processing space is interposed therebetween;
a second upper electrode and a second lower electrode installed such that a space in the second processing space is interposed therebetween;
a high-frequency power source; and
the transformer of claim 1,
wherein the high-frequency power source is electrically connected to the primary-side first coil,
the first upper electrode is electrically connected to one end of the secondary-side second coil,
the first lower electrode is electrically connected to the other end of the secondary-side second coil,
the second upper electrode is electrically connected to one end of the secondary-side third coil, and
the second lower electrode is electrically connected to the other end of the secondary-side third coil.

17. The plasma processing apparatus of claim 15, further comprising four capacitors, wherein a first capacitor is connected between the first upper electrode and the one end of the secondary-side second coil, a second capacitor is connected between the second upper electrode and the other end of the secondary-side second coil, a third capacitor is connected between the first lower electrode and the one end of the secondary-side third coil, and a fourth capacitor is connected between the second lower electrode and the other end of the secondary-side third coil.

18. The plasma processing apparatus of claim 16, further comprising a plurality of sensors, each of the plurality of sensors being a current sensor or a voltage sensor, wherein the plurality of sensors includes two sensors connected to one of the one end and the other end of the secondary-side second coil and to one of the one end and the other end of the secondary-side third coil, respectively.

19. The plasma processing apparatus of claim 18, wherein the plurality of sensors further includes two additional sensors connected to the other one of the one end and the other end of the secondary-side second coil and to the other one of the one end and the other end of the secondary-side third coil, respectively.

20. An inductively coupled plasma processing apparatus comprising:

a chamber main body configured to provide a chamber;
a lower electrode installed in the chamber;
a window member installed above the lower electrode;
a first antenna coil installed above the window member and configured to extend around a central line of the chamber, the central line extending in a vertical direction;
a second antenna coil installed above the window member and configured to extend around the central line, the second antenna coil being installed in an outer side of the first antenna coil;
a high-frequency power source; and
the transformer of claim 1,
wherein the high-frequency power source is electrically connected to the first coil,
one end and the other end of the secondary-side second coil are electrically connected to one end and the other end of the first antenna coil, respectively, and
one end and the other end of the secondary-side third coil are electrically connected to one end and the other end of the second antenna coil, respectively.

21. The plasma processing apparatus of claim 20, further comprising a plurality of capacitors wherein a first capacitor is connected between the one end of the secondary-side second coil and the one end of the first antenna coil, a second capacitor is connected between the other end of the secondary-side second coil and the other end of the first antenna coil, a third capacitor is connected between the one end of the secondary-side third coil and the one end of the second antenna coil, and a fourth capacitor is connected between the other end of the secondary-side third coil and the other end of the second antenna coil.

22. An inductively coupled plasma processing apparatus comprising:
a chamber main body configured to provide a chamber;
a lower electrode installed in the chamber;
a window member installed above the lower electrode;
an antenna coil installed above the window member;
a high-frequency power source; and
the transformer of claim 1,
wherein the high-frequency power source is electrically connected to the first coil,
one end and the other end of the secondary-side second coil are electrically connected to one end and the other end of the antenna coil, respectively, and
one end of the secondary-side third coil is electrically connected to the lower electrode.

23. The plasma processing apparatus of claim 7, wherein a self-resonance frequency of the primary-side first coil is equal to or greater than double a frequency of a high-frequency power generated by the high-frequency power source.

24. The plasma processing apparatus of claim 7, wherein the secondary-side second coil has a self-inductance greater than an impedance of a load connected to the secondary-side second coil, and the secondary-side third coil has a self-inductance greater than an impedance of a load connected to the secondary-side third coil.

* * * * *